United States Patent
Kato et al.

(10) Patent No.: US 10,584,416 B2
(45) Date of Patent: Mar. 10, 2020

(54) SUBSTRATE PROCESSING APPARATUS

(71) Applicant: TOKYO ELECTRON LIMITED, Tokyo (JP)

(72) Inventors: Hitoshi Kato, Oshu (JP); Yukio Ohizumi, Oshu (JP); Manabu Honma, Oshu (JP); Takeshi Kobayashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 417 days.

(21) Appl. No.: 15/420,352

(22) Filed: Jan. 31, 2017

(65) Prior Publication Data
US 2017/0218514 A1   Aug. 3, 2017

(30) Foreign Application Priority Data

Feb. 2, 2016   (JP) .................................. 2016-018314
Nov. 29, 2016  (JP) .................................. 2016-231407

(51) Int. Cl.
*H01J 37/32* (2006.01)
*H01L 21/687* (2006.01)
(Continued)

(52) U.S. Cl.
CPC ........ *C23C 16/4584* (2013.01); *C23C 16/402* (2013.01); *C23C 16/4409* (2013.01);
(Continued)

(58) Field of Classification Search
CPC .............. C23C 16/4584; C23C 16/402; C23C 16/4409; C23C 16/45527; C23C 16/45536; C23C 16/45551; C23C 16/45585; H01J 37/3244; H01J 37/32715; H01J 37/32733; H01J 37/32779; H01L 21/68764;
(Continued)

(56) References Cited

U.S. PATENT DOCUMENTS 3,961,214 A * 6/1976 Lokkart ................. G01P 3/488
                                                 310/155
5,711,223 A * 1/1998 Taylor .................... B41F 27/02
                                                 101/389.1
(Continued)

FOREIGN PATENT DOCUMENTS

CN    105568259 A      5/2016
JP    61039540 A    *  2/1986
JP    2009-170822 A    7/2009

*Primary Examiner* — Charlee J C Bennett
(74) *Attorney, Agent, or Firm* — Nath, Goldberg & Meyer; Jerald L. Meyer

(57) ABSTRACT

A substrate processing apparatus includes a mounting stand installed to rotate about a rotation shaft extending along a rotary shaft of a rotary table and configured to hold a substrate, and a magnetic gear mechanism including a driven gear configured to rotate the mounting stand about the rotation shaft and a driving gear configured to drive the driven gear. The driven gear is connected to the mounting stand via the rotation shaft and installed to rotate in such a direction as to rotate the mounting stand. The driving gear is disposed in a state in which the driving surface faces the driven surface passing through a predetermined position on a movement orbit of the driven gear moving along with the rotation of the rotary table.

9 Claims, 30 Drawing Sheets

(51) Int. Cl.
*C23C 16/458* (2006.01)
*C23C 16/40* (2006.01)
*C23C 16/455* (2006.01)
*C23C 16/44* (2006.01)

(52) U.S. Cl.
CPC .. *C23C 16/45527* (2013.01); *C23C 16/45536* (2013.01); *C23C 16/45551* (2013.01); *C23C 16/45585* (2013.01); *H01J 37/3244* (2013.01); *H01J 37/32715* (2013.01); *H01J 37/32733* (2013.01); *H01J 37/32779* (2013.01); *H01L 21/68764* (2013.01); *H01L 21/68771* (2013.01); *H01L 21/68785* (2013.01); *H01L 21/68792* (2013.01)

(58) Field of Classification Search
CPC ......... H01L 21/68771; H01L 21/68785; H01L 21/68792
USPC ................... 118/715–733; 156/345.1–345.55
See application file for complete search history.

(56) References Cited

U.S. PATENT DOCUMENTS

| | | | | |
|---|---|---|---|---|
| 5,795,448 A * | 8/1998 | Hurwitt | ............... | H01L 21/6715 118/729 |
| 5,871,588 A * | 2/1999 | Moslehi | ............... | C23C 16/4584 118/500 |
| 5,944,149 A * | 8/1999 | Kuwahara | ........... | H02K 49/043 188/156 |
| 6,086,005 A * | 7/2000 | Kobayashi | ....... | A01K 89/01555 188/182 |
| 6,454,908 B1 * | 9/2002 | Schertler | ........... | H01L 21/68764 118/719 |
| 10,072,336 B2 * | 9/2018 | Kato | ................. | C23C 16/45544 |
| 10,221,480 B2 * | 3/2019 | Kato | ..................... | C23C 16/402 |
| 2003/0029384 A1 * | 2/2003 | Nishikawa | .......... | C23C 16/4584 118/730 |
| 2010/0050943 A1 * | 3/2010 | Kato | ..................... | C23C 16/401 118/730 |
| 2010/0219160 A1 * | 9/2010 | Schmidt | ............ | H01J 37/32678 216/67 |
| 2010/0322603 A1 * | 12/2010 | Shim | ................. | H01L 21/68764 392/418 |
| 2011/0303527 A1 * | 12/2011 | Hosoya | ................. | B82Y 10/00 204/192.15 |
| 2014/0110253 A1 * | 4/2014 | Tamagaki | ............ | C23C 16/509 204/298.06 |
| 2018/0037990 A1 * | 2/2018 | Kato | ................. | C23C 16/45527 |
| 2018/0195173 A1 * | 7/2018 | Kato | ..................... | C23C 16/402 |
| 2018/0251892 A1 * | 9/2018 | Kobayashi | .......... | C23C 16/4584 |

\* cited by examiner

SUBSTRATE PROCESSING APPARATUS

CROSS-REFERENCE TO RELATED APPLICATIONS

This application claims the benefit of Japanese Patent Application Nos. 2016-018314 and 2016-231407, filed on Feb. 2, 2016 and Nov. 29, 2016, respectively, in the Japan Patent Office, the disclosures of which are incorporated herein in their entirety by reference.

TECHNICAL FIELD

The present disclosure relates to a technique of processing substrates by supplying a process gas to the substrates while revolving the substrates.

BACKGROUND

In a manufacturing process of a semiconductor device, for example, an ALD (Atomic Layer Deposition) is performed in order to form various films for the formation of an etching mask and the like on a semiconductor wafer (hereinafter referred to as wafer) which is a substrate. In order to enhance the productivity of a semiconductor device, the ALD is often performed by an apparatus which rotates a rotary table holding a plurality of wafers to revolve the wafers and to allow the wafers to repeatedly pass through process gas supply regions (process regions) disposed along the circumferential direction of the rotary table. Furthermore, CVD (Chemical Vapor Deposition) is often performed in order to form the respective films mentioned above. Similar to the ALD, the film formation by the CVD may be performed by revolving the wafers.

In such a film forming process which revolves the wafers, it is required to perform film formation with high uniformity in the circumferential direction of the wafer. Thus, it is required that film formation be performed with high uniformity over the entire surface of the wafer W by forming a concentric film thickness distribution on the wafer W and performing film formation with high uniformity even in the radial direction of the wafer W. The term "concentric film thickness distribution" refers, more specifically, to a film thickness distribution in which the film thickness is equal or substantially equal in the respective positions along the circumferential direction of the wafer, which are equidistant from the center of the wafer, and the film thickness becomes different in the respective positions along the radial direction of the wafer.

However, in the film forming apparatus which revolves the wafers, the process gas is supplied along the radial direction of the rotary table. Therefore, the film thickness distribution formed on the wafer tends to become a film thickness distribution in which the film thickness changes from the center side toward the peripheral side of the rotary table. This poses a problem in that it is difficult to form a uniform film thickness distribution in the circumferential direction of the wafer. For example, there is known a film forming apparatus which forms the concentric film thickness distribution by performing CVD so that a predetermined temperature distribution is formed in the plane of a wafer. In this film forming apparatus, the wafer is not revolved during a film forming process. Accordingly, such related art is not capable of solving the aforementioned problem.

In addition, even when forming a concentric film on a wafer, there is required a method capable of realizing high reproducibility of film forming conditions and capable of controlling and adjusting film forming conditions.

SUMMARY

Some embodiments of the present disclosure provide a substrate processing apparatus capable of, when performing a process by supplying a process gas to substrates placed on one surface side of a rotary table while revolving the substrates, performing the process uniformly along the circumferential direction of the substrates.

According to one embodiment of the present disclosure, there is provided a substrate processing apparatus in which a substrate is mounted on one surface side of a rotary table installed inside a process container and configured to rotate about a rotary shaft and in which a process is performed by supplying a process gas to the substrate while rotating the rotary table and consequently revolving the substrate, including: a mounting stand installed to rotate about a rotation shaft extending along the rotary shaft of the rotary table and configured to hold the substrate; and a magnetic gear mechanism including a driven gear portion configured to rotate the mounting stand about the rotation shaft and a driving gear portion configured to drive the driven gear portion, wherein the driven gear portion is connected to the mounting stand via the rotation shaft and installed to rotate in such a direction as to rotate the mounting stand, the driven gear portion including a driven surface configured to form magnetic force lines with a driving surface provided in the driving gear portion, and the driving gear portion is disposed in a state in which the driving surface faces the driven surface passing through a predetermined position on a movement orbit of the driven gear portion moving along with the rotation of the rotary table, the driving gear portion connected to a drive part configured to move the driving surface in order to move the magnetic force lines and rotate the driven gear portion.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As one embodiment of a substrate processing apparatus of the present disclosure, a film forming apparatus 1 for performing ALD as a film forming process on wafers W as substrates will be described. In the film forming apparatus 1 of this example, a molecular layer of $SiO_2$ (silicon oxide) is formed by allowing a BTBAS (bis(tertiary-butylamino)silane) gas, which is a raw material gas containing Si (silicon), onto the wafers W and then supplying an ozone ($O_3$) gas, which is an oxidizing gas for oxidizing the BTBAS gas. In order to modify this molecular layer, the molecular layer is exposed to plasma generated from a plasma generating gas. An $SiO_2$ film is formed by repeatedly performing theses series of processes a plurality of times. The raw material gas, the oxidizing gas and the plasma generating gas correspond to the process gases of the present embodiment.

Figure 1:
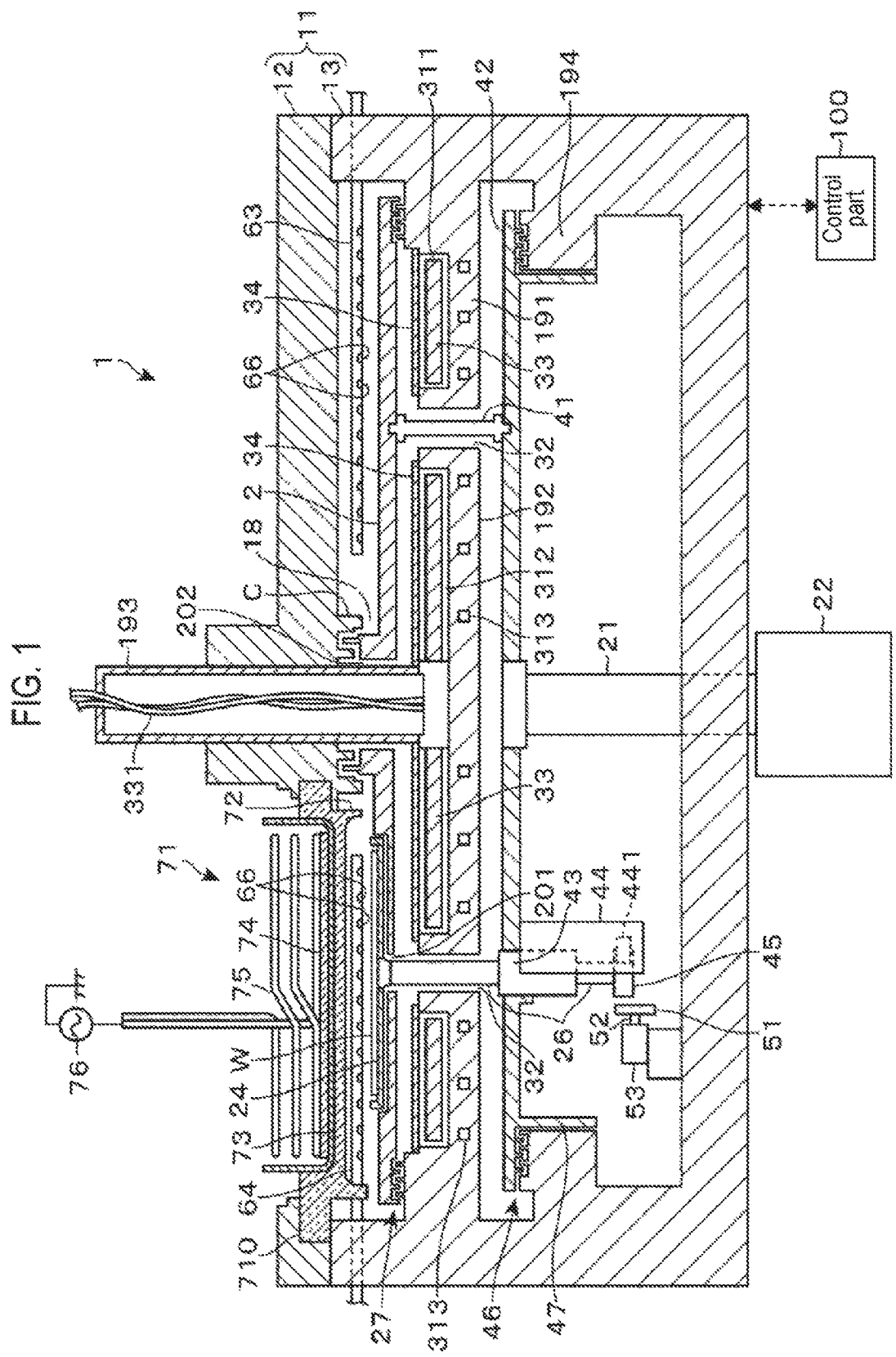
FIG. 1 is a vertical sectional side view of a film forming apparatus according to an embodiment of the present disclosure.
Figure 2:
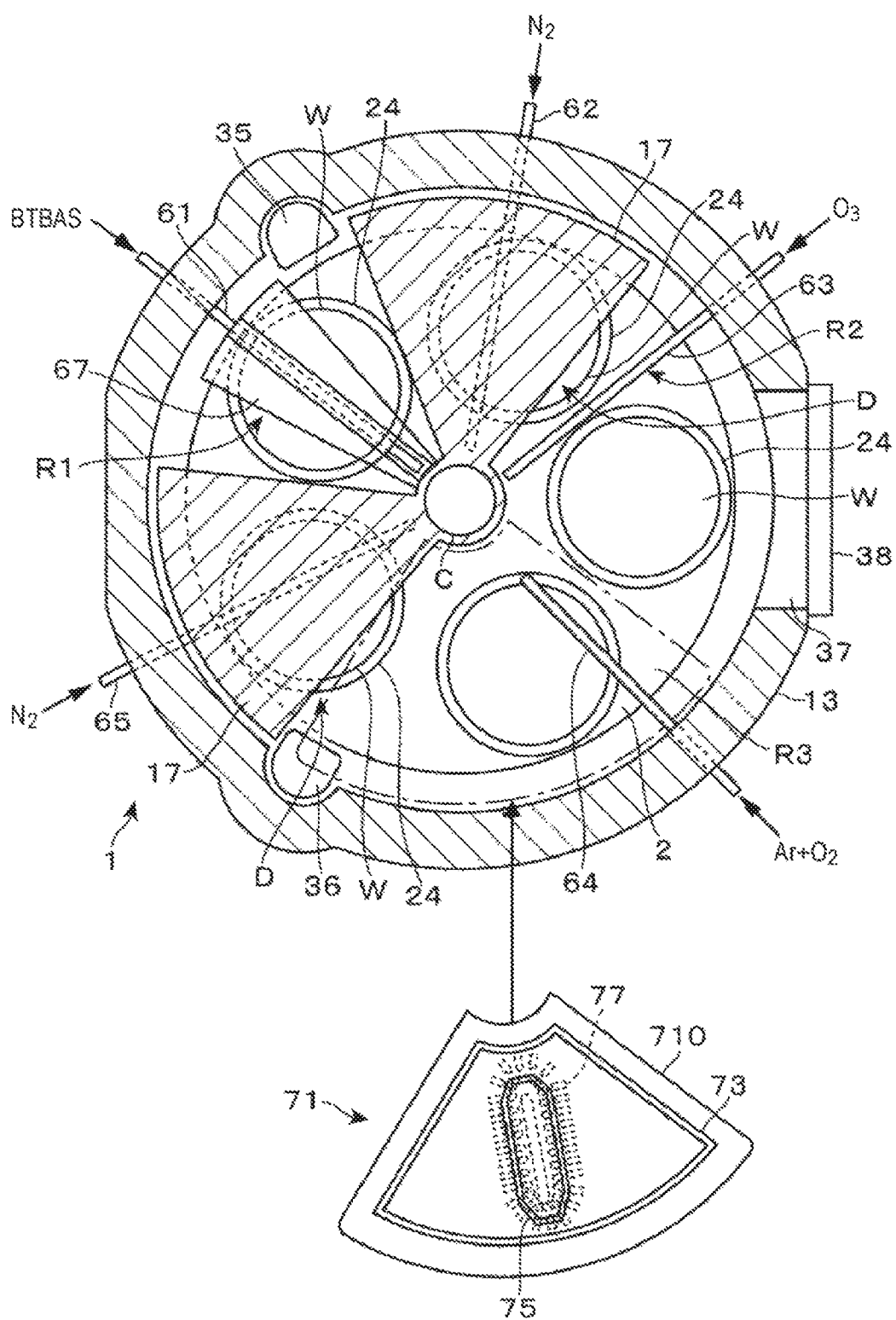
FIG. 2 is a horizontal sectional plane view of the film forming apparatus.

As shown in FIGS. 1 and 2, the film forming apparatus 1 includes a substantially circular flat vacuum container (process container) 11 and a disc-shaped rotary table 2 horizontally disposed inside the vacuum container 11. The vacuum container 11 is configured by a top plate 12 and a container body 13 which forms a sidewall and a bottom portion of the vacuum container 11.

The rotary table 2 is connected, via a support plate 42 to be described later, to a rotary shaft 21 extending vertically downward from a position on the lower side of a central portion of the rotary table 2. In order to keep the interior of the vacuum container 11 airtight from the external atmosphere, the rotary shaft 21 is configured to penetrate a bearing portion (not shown) provided in the bottom portion of the container body 13 and is connected to a revolution-purpose rotational drive part 22 disposed on the lower side of the container body 13. By rotating the rotary shaft 21 using the revolution-purpose rotational drive part 22, it is possible to rotate the rotary table 2, for example, clockwise, when viewed from the upper surface side.

On the lower surface of the top plate 12 constituting the vacuum container 11, there are formed a central region forming portion C having a circular shape in a plane view and protruding downward so as to face the central portion of the rotary table 2, and a protrusion portions 17 and 17 having a fan-like shape in a plane view and formed so as to extend from the central region forming portion C toward the outside of the rotary table 2. The central region forming portion C and the protrusion portions 17 and 17 form a ceiling surface, which is lower than the outer region thereof, in the internal space of the vacuum container 11. The gap between the central region forming part C and the central portion of the rotary table 2 constitutes a flow path 18 of a $N_2$ gas. During the processing of the wafers W, by supplying a $N_2$ gas from a gas supply pipe (not shown) toward the inner region of the central region forming portion C, the $N_2$ gas is discharged from the flow path 18 toward the entire outer circumference of the rotary table 2. The $N_2$ gas plays a role of preventing a raw material gas and an oxidizing gas from making contact with each other on the central portion of the rotary table 2.

Figure 3:
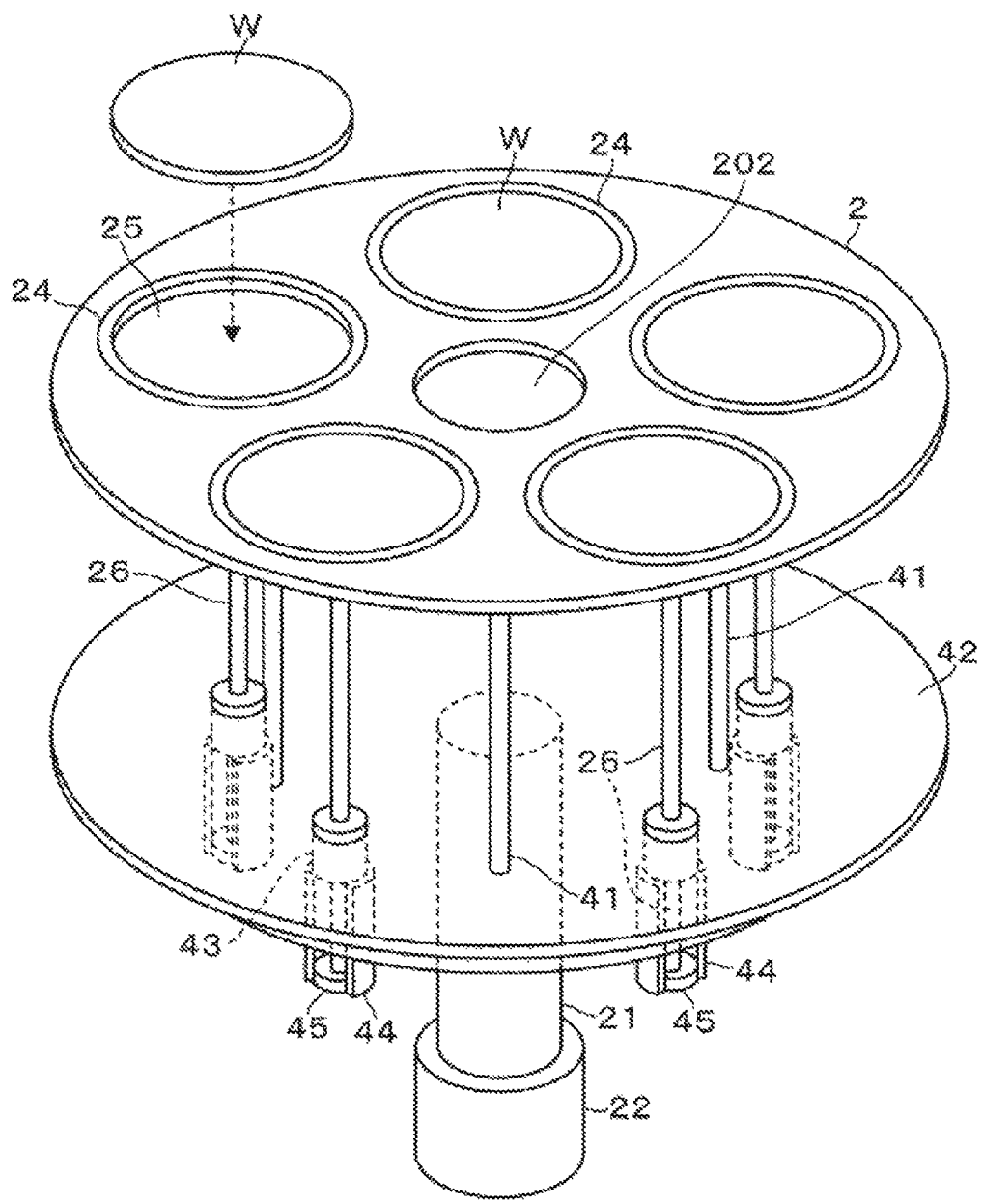
FIG. 3 is a perspective view of a rotary table installed inside the film forming apparatus.
Figure 11:
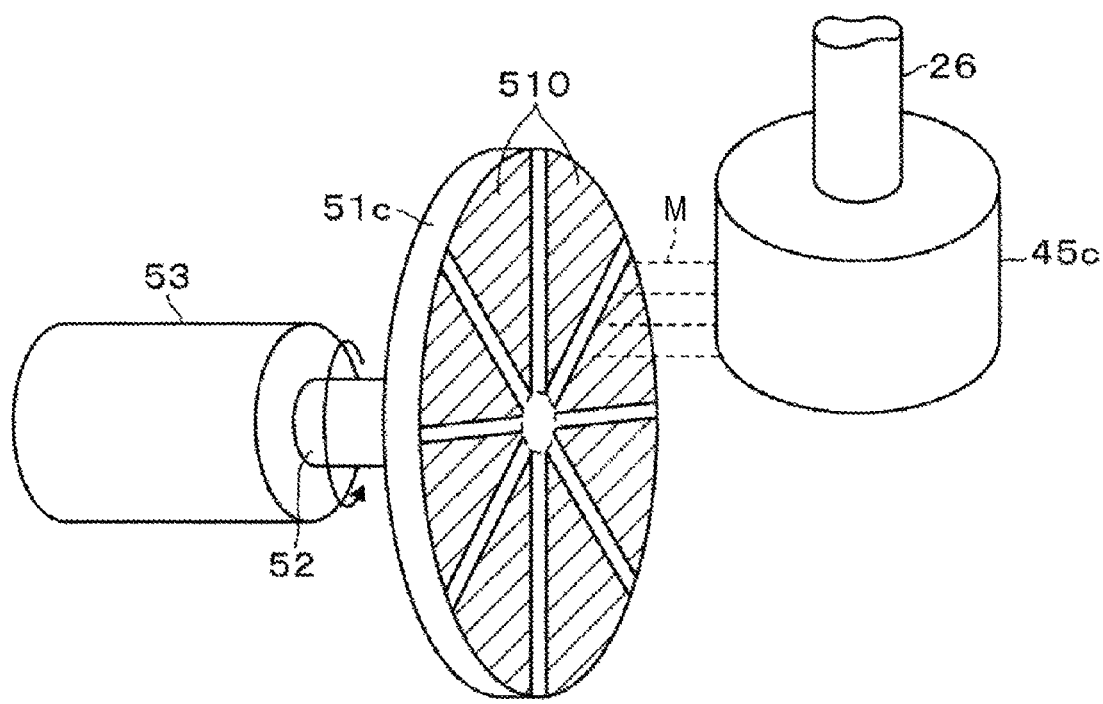
FIG. 11 is an enlarged perspective view of a magnetic gear mechanism according to a second embodiment.

Next, the structure on the lower side of the rotary table 2 will be described. As shown in FIGS. 11 and 3, in the film forming apparatus 1 of this example, the rotary table 2 is supported from the lower side by a disc-shaped support plate 42. The support plate 42 supports wafer holders 24, which will be described later, on which wafers W are placed, independently from the rotary table 2, and has a structure that does not apply the load of the equipment related to the wafer holders 24 to the rotary table 2.

As shown in FIG. 1, in order to separately accommodate the rotary table 2 and the support plate 42 vertically spaced apart from each other, the internal space of the vacuum container 11 is vertically divided by a peripheral transverse wall portion 191 and a central transverse wall portion 192. In this example, the peripheral transverse wall portion 191 is configured by a substantially annular member provided so as to laterally protrude from the inner wall surface of the container body 13 toward the center portion of the container body 13. On the inner side of an opening of the annular member constituting the peripheral transverse wall portion 191, the central transverse wall portion 192 configured by a substantially disc-shaped member is disposed substantially in the same height position as the peripheral transverse wall portion 191.

As shown in FIG. 1, the central transverse wall portion 192 is suspended and supported by a hanging support portion 193 provided so as to vertically penetrate the central portion of the top plate 12. At this time, the central portion of the rotary table 2 arranged on the upper side of the central transverse wall 192 is provided with an opening 202 through which the hanging support portion 193 penetrates. With this configuration, the rotational operation of the rotary table 2 is not hindered by the hanging support portion 193 for hanging and supporting the central transverse wall 192 (see FIG. 3).

The diameter of the central transverse wall portion 192 is smaller than the diameter of the opening of the peripheral transverse wall portion 191. An annular slit 32 for bringing the upper and lower spaces of the transverse wall portions 191 and 192 into communication with each other is formed between the outer circumferential surface of the central transverse wall portion 192 and the inner circumferential surface of the peripheral transverse wall portion 191. The internal space of the vacuum container 11 is vertically partitioned by the above-described configuration. The rotary table 2 is accommodated in the space on the upper side of the peripheral transverse wall portion 191 and the central transverse wall portion 192. The support plate 42 for supporting the rotary table 2 and the like is accommodated in the space on the lower side of the peripheral transverse wall portion 191 and the central transverse wall portion 192 (see FIG. 1).

As shown in FIG. 1, a recess 311 having an annular shape when viewed from the upper surface side is formed on the upper surface of the peripheral transverse wall portion 191, and a recess 312 having a circular shape when viewed from the upper surface side is formed on the upper surface of the central transverse wall portion 192. Heaters 33 for heating the wafers W mounted on the upper surface side of the rotary table 2 are disposed in these recesses 311 and 312. The heaters 33 have a configuration in which a large number of heater elements made of, for example, an elongated tubular carbon wire heater, are arranged in an annular shape. In FIG. 1 and the like, the heaters 33 are shown in a simplified manner. Electric power is supplied to the heater 33 of the central transverse wall portion 192 via, for example, a power supply line 331 disposed in the hanging support portion 193. On the other hand, electric power is supplied to the heater 33 of the peripheral transverse wall portion 191 via a power supply line (not shown) which is disposed so as to penetrate through the sidewall of the container body 13 or the like.

A $N_2$ gas is supplied by gas nozzles (not shown) into the internal spaces of the recesses 311 and 312 in which the heaters 33 are installed, thereby suppressing entry of process gases into the internal spaces of the recesses 311 and 312. In addition, the openings on the upper surface sides of the respective recesses 311 and 312 are closed by shields 34. Furthermore, on the bottom side of the peripheral transverse wall portion 191 and the central transverse wall portion 192 which accommodate the heaters 33 having a high temperature, there are formed coolant flow paths 313 through which a coolant for cooling the members constituting the peripheral transverse wall portion 191 and the central transverse wall portion 192 flows. The $N_2$ gas and the coolant are also supplied via a $N_2$ gas flow path (not shown) and a coolant supply path (not shown) formed in the hanging support portion 193 and the sidewall of the container body 13.

Figure 4:
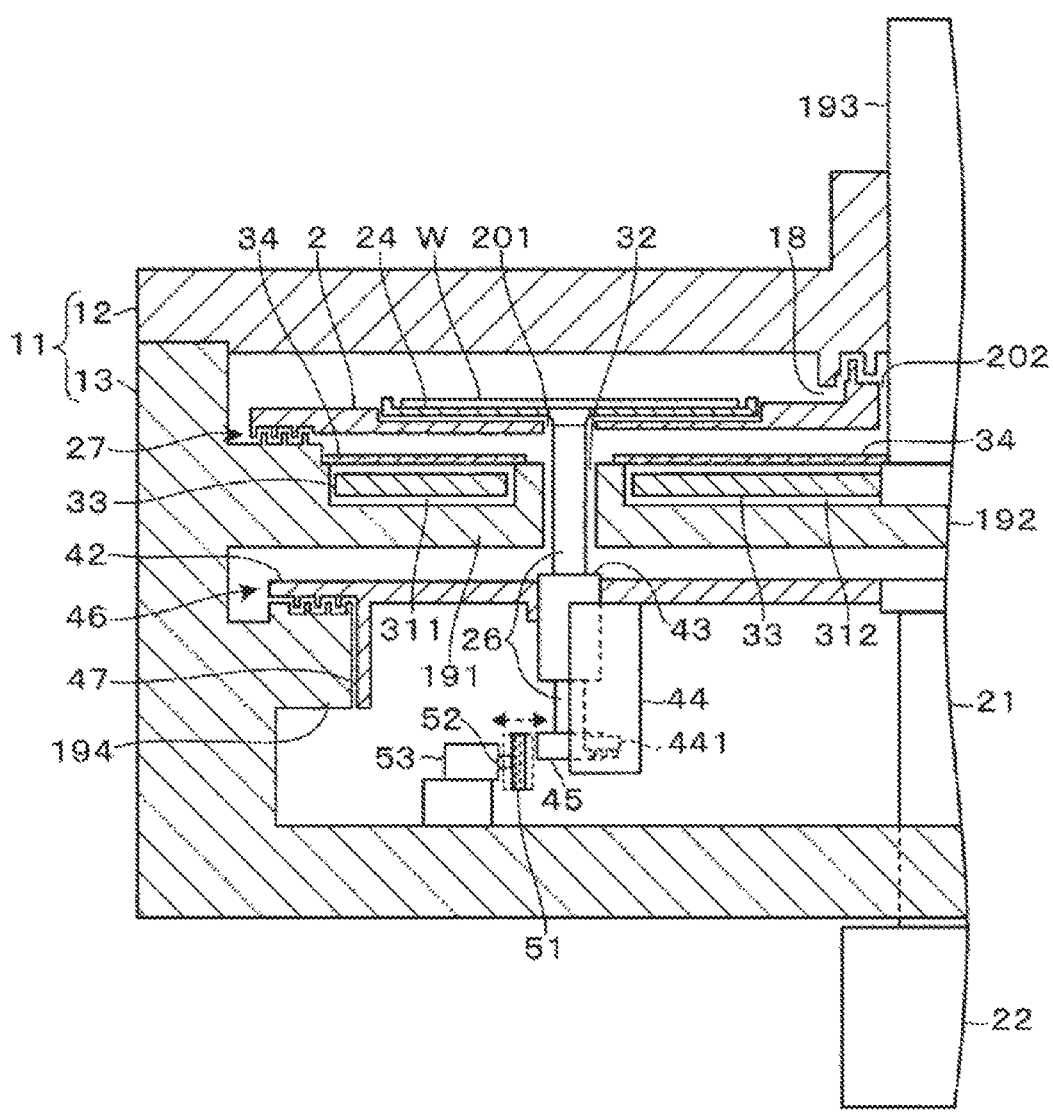
FIG. 4 is an enlarged vertical sectional side view of the film forming apparatus.

Furthermore, as shown in the enlarged vertical sectional views of FIGS. 1 and 4, a labyrinth seal portion 27 formed by combining a plurality of annular ridges and grooves formed on the lower surface of the rotary table 2 and a plurality of annular ridges and grooves formed on the upper surface of the peripheral transverse wall portion 191 is provided between the peripheral region of the lower surface of the rotary table 2 and the peripheral region of the upper surface of the peripheral transverse wall portion 191. The labyrinth seal portion 27 restrains various process gases, which are supplied to the upper surface side of the rotary table 2, from entering the space on the lower surface side of the rotary table 2. Even when particles are generated in a below-described bearing unit 43 or the like, the labyrinth seal portion 27 restrains the particles from entering the space on the upper side of the rotary table 2.

Furthermore, as shown in FIG. 2, exhaust ports 35 and 36 for evacuating the inside of the vacuum container 11 are opened on the outer side of the rotary table 2 in the space above the peripheral transverse wall portion 191 and the central transverse wall portion 192. A vacuum exhaust mechanism (not shown) including a vacuum pump or the like is connected to the exhaust ports 35 and 36.

Next, the structure of the rotary table 2 will be described in more detail with reference to FIG. 3. On the upper surface side (one surface side) of the rotary table 2, wafer holders 24 having a circular shape, when viewed in a plane view, are provided along the rotation direction of the rotary table 2. A concave portion 25 is formed on the upper surface of each of the wafer holders 24. The wafer W is horizontally accommodated in the concave portion 25. The wafer holders 24 correspond to wafer mounting stands.

A plurality of struts 41 is provided in a mutually spaced-apart relationship in the circumferential direction on the lower surface of the rotary table 2 so as to extend vertically downward from a position corresponding to the slit 32 when viewed from the center of the rotary table 2. As shown in FIG. 1, the respective struts 41, which pass through the slit 32, are connected to the support plate 42 which is a support part accommodated in the space on the lower side of the peripheral transverse wall portion 191 and the central transverse wall portion 192. As shown in FIGS. 1 and 3, the lower-surface-side central portion of the support plate 42 is connected to the upper end portion of the rotary shaft 21 described above. Therefore, when the rotary shaft 21 is rotated, the rotary table 2 rotates about a vertical axis via the support plate 42 and the struts 41.

Next, the configuration of the wafer holders 24 will be described. In the central portion on the lower surface side of each wafer holder 24, a rotation shaft 26 supporting the wafer holder 24 is provided so as to extend vertically downward. The rotation shaft 26 is inserted into the opening 201 formed in the rotary table 2. The rotation shaft 26 passes through the slit 32. The rotation shaft 26 is supported by a bearing unit 43 fixed to the above-mentioned support plate 42. Therefore, the wafer holder 24 is supported by the support plate 42 via the rotation shaft 26 independently of the rotary table 2.

The bearing unit 43 includes a bearing for rotatably holding the rotation shaft 26 and a magnetic seal for preventing particles from being scattered from the bearing (both of which are not shown). The lower side of the rotation shaft 26 penetrates the bearing unit 43 and extends toward the lower surface side of the support plate 42. A driven gear portion 45 to be described later is provided in the lower end portion of the rotation shaft 26.

As shown in FIGS. 1 and 4, the peripheral region of the lower surface of the support plate 42 is disposed so as to face the upper surface of a substantially annular protrusion 194 provided so as to transversely protrude from the inner wall surface of the container body 13 toward the central portion of the container body 13. A labyrinth seal portion 46 formed by combining a plurality of annular ridges and grooves formed on the lower surface of the support plate 42 and a plurality of annular ridges and grooves formed on the upper surface of the protrusion 194 is provided between the support plate 42 and the protrusion 194.

A cylindrical wall portion 47 is formed inside the labyrinth seal portion 46 so as to extend downward from the lower surface of the support plate 42. The cylindrical wall portion 47 is inserted into the inside of the protrusion 194 described above. A narrow gap is formed between the outer circumferential surface of the cylindrical wall portion 47 and the inner circumferential surface of the protrusion 194. The labyrinth seal portion 46 and the cylindrical wall portion 47 restrain various process gases from entering the space on the lower surface side of the support plate 42 from the upper surface side of the support plate 42. Even when particles are generated in the bearing unit 43 and a rotational drive part 53 to be described later, the labyrinth seal portion 46 and the cylindrical wall portion 47 restrain the particles from entering the space above the support plate 42.

Explaining another structure of the vacuum container 11, as shown in FIG. 2, the side wall of the container body 13 is provided with a loading/unloading gate 37 for the wafer W and a gate valve 38 for opening and closing the loading/unloading gate 37. By allowing an external transfer mechanism to enter the vacuum container 11 via the loading/unloading gate 37, the wafer W is transferred between the transfer mechanism and the wafer holder 24. More specifically, there are formed through-holes which vertically penetrate the bottom surface of the concave portion 25 of each wafer holders 24, the peripheral transverse wall portion 191, the support plate 42 and the bottom portion of the container body 13 when the wafer holder 24 is moved to a position facing the loading/unloading gate 37. Lift pins, which move up and down through the through-holes, are configured so that the upper ends of the lift pins are moved up and down between the upper surface side of the concave portion 25 and the lower side of the support plate 42. The transfer of the wafer W is carried out through the use of lift pins. The illustration of the lift pins and the through holes is omitted.

As shown in FIGS. 1 and 2, on the upper side of the rotary table 2, a raw material gas nozzle 61, a separation gas nozzle 62, an oxidizing gas nozzle 63, a plasma generating gas nozzle 64, and a separation gas nozzle 65 are arranged in this order in a spaced-apart relationship along the rotation direction of the rotary table 2. Each of the gas nozzles 61 to 65 is formed like a rod extending horizontally along the radial direction of the rotary table 2 from the sidewall of the vacuum container 11 to the central portion thereof. Various kinds of gases are discharged downward from a large number of discharge holes 66 formed in a mutually spaced-apart relationship along the radial direction of the rotary table 2.

The raw material gas nozzle 61 discharges the aforementioned BTBAS (bis(tertiary-butylamino)silane) gas. In FIG. 2, reference numeral 67 denotes a nozzle cover that covers the raw material gas nozzle 61. The nozzle cover 67 is formed in a fan-like shape so as to extend from the raw material gas nozzle 61 toward the upstream side and the downstream side in the rotation direction of the rotary table 2. The nozzle cover 67 plays a role of increasing the concentration of the BTBAS gas under the nozzle cover 67 and increasing the adsorptivity of the BTBAS gas to the wafer W. In addition, the oxidizing gas nozzle 63 discharges the aforementioned ozone gas. The separation gas nozzles 62 and 65 discharge an $N_2$ gas. The separation gas nozzles 62 and 65 are disposed in such positions as to circumferentially divide the fan-like protrusion portions 17 and 17 of the top plate 12 when viewed from the upper surface side. The plasma generating gas nozzle 64 discharges a plasma generating gas composed of, for example, a mixed gas of an argon (Ar) gas and oxygen ($O_2$) gas.

Furthermore, a fan-shaped opening is formed in the top plate 12 along the rotation direction of the rotary table 2. A plasma forming part 71 is provided so as to close the opening.

The plasma forming part 71 includes a cup-shaped body portion 710 made of a dielectric material such as quartz or the like. The opening on side of the top plate 12 is closed by the body portion 710. The plasma forming part 71 is provided between the oxidizing gas nozzle 63 and the protrusion portion 17 when viewed in the rotation direction of the rotary table 2. In FIG. 2, the position where the plasma forming part 71 is provided is indicated by a chain line.

On the lower surface side of the body portion 710, there is provided a ridge portion 72 protruding downward along the aforementioned fan-shaped opening (see FIG. 1). The tip portion of the plasma generating gas nozzle 64 described above is inserted into the region surrounded by the ridge portion 72 from the outer periphery side of the rotary table 2 so that the plasma generating gas nozzle 64 can discharge a gas into the region surrounded by the ridge portion 72. The ridge portion 72 plays a role of suppressing the entry of the $N_2$ gas, the ozone gas and the BTBAS gas to the lower side of the plasma forming part 71 and suppressing a decrease in the concentration of the plasma generating gas.

A concave portion is formed on the upper surface side of the body portion 710 of the plasma forming part 71. A box-shaped Faraday shield 73 opened toward the upper surface side is disposed in the concave portion. In the bottom portion of the Faraday shield 73, an antenna 75 in which a metal wire is wound like a coil around a vertical axis is installed via an insulation-purpose plate member 74. A high frequency power supply 76 is connected to the antenna 75.

Furthermore, on the bottom surface of the Faraday shield 73, there are formed slits 77 for preventing an electric field component of an electromagnetic field generated in the antenna 75 from going downward when applying a high frequency to the antenna 75 and for allowing a magnetic field component to go downward. As shown in FIG. 2, the slits 77 extends in a direction orthogonal to (intersecting) the winding direction of the antenna 75. The slits 77 are formed in a large number along the winding direction of the antenna 75.

If a high frequency is applied to the antenna 75 by turning on the high frequency power supply 76 using the plasma forming part 71 having the aforementioned configuration, the plasma generating gas supplied to the lower side of the plasma forming part 71 can be turned into plasma. For the sake of convenience of illustration, in the enlarged vertical sectional view of FIG. 4, the plasma forming part 71, the plasma generating gas nozzle 64 on the lower side thereof and the coolant flow path 313 are not shown.

On the rotary table 2, the lower region of the nozzle cover 67 of the raw material gas nozzle 61 is defined as an adsorption region R1 where adsorption of the BTBAS gas as a raw material gas is performed. The lower region of the oxidizing gas nozzle 63 is defined as an oxidizing region R2 where the BTBAS gas is oxidized by an ozone gas. Furthermore, the lower region of the plasma forming part 71 is defined as a plasma forming region R3 where the $SiO_2$ film is modified by plasma. The lower regions of the protrusion portions 17 and 17 constitute separation regions D and D where the adsorption region R1 and the oxidizing region R2 are separated from each other by the $N_2$ gas discharged from the separation nozzles 62 and 65, thereby preventing the mixing of the raw material gas with the oxidizing gas.

In this regard, the above-described exhaust port 35 provided in the container body 13 is opened to the outside between the adsorption region R1 and the separation region D adjacent to the adsorption region R1 on the rotation-direction downstream side thereof. The exhaust port 35 is configured to exhaust an excess BTBAS gas. Furthermore, the exhaust port 36 is opened to the outside of the vicinity of the boundary between the plasma forming region R3 and the separation region D adjacent to the plasma forming region R3 on the rotation-direction downstream side thereof. The exhaust port 36 is configured to exhaust an excess $O_3$ gas and an excess plasma generating gas. The $N_2$ gas supplied from each of the separation regions D and the central region forming portion C of the rotary table 2 is also exhausted from the respective exhaust ports 35 and 36.

In the film forming apparatus 1 having the above-described configuration, when the wafers W mounted on the wafer holders 24 are revolved about the vertically-extending rotary shaft 21 by rotating the rotary table 2, each of the wafer holders 24 may rotate about the vertically-extending rotation shaft 26 which supports the lower-surface-side central portion of each of the wafer holders 24. Hereinafter, a mechanism for rotating each of the wafer holders 24 will be described in detail with reference to FIGS. 4 and 5.

Figure 5:
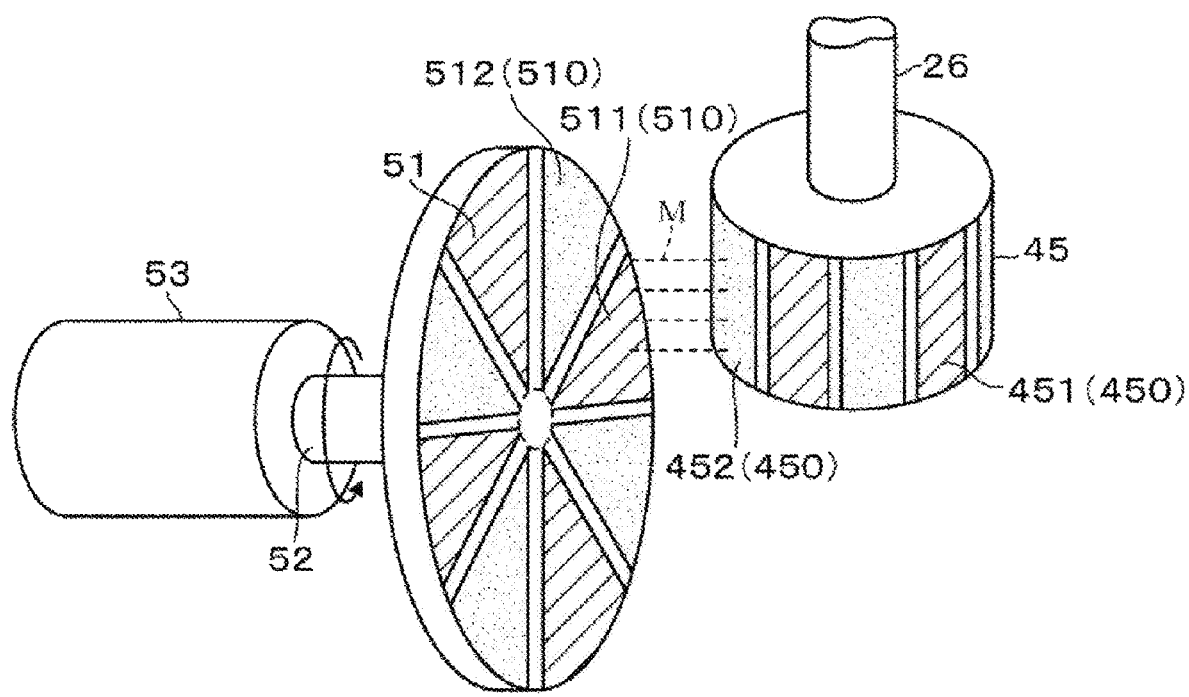
FIG. 5 is an enlarged perspective view of a magnetic gear mechanism for rotating a mounting stand installed in the rotary table.

As shown in FIGS. 4 and 5, the lower end portion of each rotation shaft 26 penetrating the bearing unit 43 is connected to the upper surface of the driven gear portion 45, which is a flat cylindrical column, with the center axes thereof aligned with each other. Therefore, the driven gear portion 45 is connected to the wafer holder 24 via the rotation shaft 26. Since the bearing unit 43 rotatably holds the rotation shaft 26, when the driven gear portion 45 is rotated in the circumferential direction, each wafer holder 24 can be rotated about the rotation shaft 26.

As shown in FIG. 5, a plurality of permanent magnets 450 is disposed on the side circumferential surface of the driven gear portion 45 in a mutually spaced-apart relationship. These permanent magnets 450 are alternately disposed so that the poles (an N pole face 451 and an S pole face 452) exposed on the side circumferential surface of the driven gear portion 45 are different between the permanent magnets 450 and 450 disposed adjacent to each other. The N pole face 451 and the S pole face 452 exposed on the side circumferential surface of the driven gear portion 45 are formed in, for example, a rectangular shape extending in the vertical direction from the upper edge to the lower edge of the side circumferential surface. The side circumferential surface of the driven gear portion 45 on which the permanent magnets 450 are disposed corresponds to the driven surface of the driven gear portion 45.

Since the rotation shaft 26 connected to the driven gear portion 45 is supported by the support plate 42 common to the rotary table 2 as described above, when the rotary table 2 is rotated, each rotation shaft 26 also revolves around the rotary shaft 21 along the slit 32. Therefore, the driven gear portion 45 provided in the lower end portion of the rotation shaft 26 also moves along a movement orbit O corresponding to the slit 32 (see the movement orbit O indicated by a broken line in FIGS. 6 to 8).

As shown in FIG. 4, a driving gear portion 51, which is a disc for rotating the driven gear portion 45 in the circumferential direction, is disposed in the bottom portion of the container body 13 positioned on the lower side of the support plate 42. The driving gear portion 51 is disposed in such a position that, when the driven gear portion 45 passes through a preset position on the movement orbit O, the driving gear portion 51 causes one surface of the disc to face the side circumferential surface (driven surface) of the driven gear portion 45.

As shown in FIG. 5, a plurality of permanent magnets 510 is disposed on the one surface side of the driving gear portion 51 in a mutually spaced-apart relationship. These permanent magnets 510 are alternately disposed so that the poles (an N pole face 511 and an S pole face 512) exposed on one surface of the driving gear portion 51 are different between the permanent magnets 510 and 510 disposed adjacent to each other.

Furthermore, the N pole face 511 and the S pole face 512 exposed on one surface of the driving gear portion 51 are formed in a fan-like shape radially extending from the central portion of one surface of the circular driving gear portion 51 toward the peripheral edge portion thereof so as to overlap with the shape of the N pole face 451 and the S pole face 452 formed on the side circumferential surface of the driven gear portion 45 passing through a region opposed to the one surface. One surface of the driving gear portion 51 on which the permanent magnets 510 are disposed corresponds to the driving surface of the driving gear portion 51.

In the driving gear portion 51, one end of a drive shaft 52 is connected to the central portion of the surface of the driving gear portion 51 opposite to the one surface on which the permanent magnets 510 are disposed. A rotational drive part 53 is provided at the other end of the drive shaft 52. By rotating the drive shaft 52 using the rotational drive part 53, the driving gear portion 51 can be rotated about the rotation center. As shown in FIG. 5, the drive shaft 52 of the driving gear portion 51 is disposed so as to extend in a direction intersecting the rotation shaft 26 connected to the driven gear portion 45.

Furthermore, the rotational drive part 53 can move the tip end position of the drive shaft 52 connected to the driving gear portion 51 back and forth. As a result, as indicated by a broken line in FIG. 4, it is possible to adjust the distance between one surface (driving surface) of the driving gear portion 51 and the side circumferential surface (driven surface) of the driven gear portion 45. The rotational drive part 53 for moving the tip end position of the drive shaft 52 also has a function of a position adjustment part of the present embodiment.

The driving gear portion 51 is disposed in such a height position that, when the driven gear portion 45 passes through the position opposed to the driving gear portion 51, the side circumferential surface of the driven gear portion 45 passes above the central portion of one surface of the driving gear portion 51. As a result, as shown in FIG. 5, the permanent magnet 450 formed in the driven gear portion 45 and the permanent magnet 510 formed in the driving gear portion 51 are brought close to each other. Relatively strong magnetic force lines M are formed between the N pole face 511 and the S pole face 452 or between the S pole face 512 and the N pole face 451.

Then, for example, when the driving gear portion 51 is rotated (the driving surface is moved) such that the permanent magnet 510 of the driving gear portion 51 moves in a direction opposite to the moving direction of the permanent magnet 450 of the driven gear portion 45, the magnetic force lines M can be moved to rotate the driven gear portion 45. As a result, the rotation of the driven gear portion 45 is transmitted to the wafer holder 24 via the rotation shaft 26. This makes it possible to rotate the wafer holder 24. The driven gear portion 45, the driving gear portion 51, the rotation shaft 26 for connecting the driven gear portion 45 and the wafer holder 24, the drive shaft 52 for driving the driving gear portion 51, the rotational drive part 53 and the like constitute a magnetic gear mechanism of the present embodiment.

As shown in FIGS. 3 and 4, a semi-cylindrical side wall portion 44 is provided on the bottom surface of the support plate 42 so as to surround the bearing unit 43 protruding from the lower surface of the support plate 42, the rotation shaft 26 and a part of the side circumferential surface of the driven gear portion 45. The side wall portion 44 is provided so as to surround the side circumferential surface of the driven gear portion 45 on the side opposite to the direction in which the driving gear portion 51 is disposed.

A semicircular ring-shaped brake portion 441 made of, for example, a ferromagnetic material, is provided in a position on the lower side of the inner peripheral surface of the side wall portion 44. For example, the distance between the side circumferential surface of the driven gear portion 45 and the brake portion 441 is adjusted so that the magnetic force lines formed between the permanent magnet 450 of the driven gear portion 45 and the brake portion 441 becomes weaker than the magnetic force lines formed between the driven gear portion 45 and the driving gear portion 51.

As a result, when the driven gear portion 45 passes through the position facing the driving gear portion 51, a force acting between the driven gear portion 45 and the driving gear portion 51 acts to rotate the driven gear portion 45. On the other hand, after the driven gear portion 45 passes through the position, the free rotation of the driven gear portion 45 due to the inertial force and the like can be suppressed by the force acting between the driven gear portion 45 and the brake portion 441. The inner circumferential surface of the brake portion 441 surrounding the side circumferential surface of the driven gear portion 45 corresponds to a brake surface for stopping the rotation of the driven gear portion 45.

As shown in FIG. 1, the film forming apparatus 1 having the above-described configuration is provided with a control part 100 including a computer for controlling the operation of the entire apparatus. The control part 100 stores a program for executing an operation relating to a film formation process to be described later. The program transmits a control signal to the respective parts of the film forming apparatus 1 to control the operations of respective parts. Specifically, the supply flow rate of each process gas or the like supplied from each of the gas nozzles 61 to 65, the heating temperature of the wafer W by the heater 33, the supply flow rate of the $N_2$ gas supplied from the central region forming portion C, the rotation number per unit time of the rotary table 2 rotated by the revolution-purpose rotational drive part 22, the rotation angle of the wafer holder 24 by the magnetic gear mechanism, and the like, are controlled according to the control signal. The above-mentioned program includes a group of steps for performing the control to execute the respective processes to be described later. The program is installed in the control part 100 from a storage medium such as a hard disk, a compact disk, a magneto-optical disk, a memory card, a flexible disk or the like.

Hereinafter, the operation of the film forming apparatus 1 having the above-described configuration will be described. First, while intermittently rotating the rotary table 2, each wafer holder 24 is moved to a position facing the loading-unloading gate 37. The wafer W is carried into the vacuum container 11 from the outside using a transfer mechanism (not shown), and is transferred to the wafer holder 24.

When the wafers W are placed on all the wafer holders 24, the transfer mechanism is withdrawn from the vacuum container 11, the gate valve 38 is closed, and the interior of the vacuum container 11 is evacuated via the exhaust ports 35 and 36 so that the internal pressure of the vacuum container 11 becomes a predetermined pressure. The $N_2$ gas is supplied from the separation gas nozzles 62 and 65 and the central region forming portion C to the rotary table 2. The heating of the wafers W by the heater 33 is started.

Next, when the rotary table 2 is rotated by driving the rotary shaft 21 with the revolution-purpose rotational drive part 22, the revolution of the wafers W placed on the respective wafer holders 24 is started. Along with the rotation of the rotary table 2, the rotational operation of the driving gear portion 51 arranged in the bottom portion of the container body 13 is also started. Within the vacuum container 11, along with the start of these operations, the supply of the respective process gases from the raw material gas nozzle 61, the oxidizing gas nozzle 63 and the plasma generating gas nozzle 64 and the formation of plasma by the application of a high frequency from the high frequency power supply 76 to the antenna 75 are started.

As shown in FIG. 2, in the vacuum container 11, the separation region D, to which the $N_2$ gas is supplied, is provided between the adsorption region R1 and the oxidizing region R2. Thus, the raw material gas supplied to the adsorption region R1 and the oxidizing gas supplied to the oxidizing region R2 are exhausted from the exhaust ports 35 and 36 without being mixed with each other above the rotary table 2. Furthermore, the separation region D, to which the $N_2$ gas is supplied, is also provided between the adsorption region R1 and the plasma formation region R3. Thus, the raw material gas, the plasma generating gas supplied to the plasma formation region R3 and the oxidizing gas flowing from the rotation-direction upstream side of the plasma formation region R3 to the separation region D are not mixed with each other above the rotary table 2 and are exhausted from the exhaust ports 35 and 36. The $N_2$ gas supplied from the central region forming portion C is also exhausted from the exhaust ports 35 and 36.

While performing the supply and exhaust of the respective gases as described above, the respective wafers W sequentially pass through the adsorption region R1, the oxidizing region R2 and the plasma formation region R3. In the adsorption region R1, the BTBAS gas discharged from the raw material gas nozzle 61 is adsorbed onto the wafer W. In the oxidizing region R2, the adsorbed BTBAS gas is oxidized by the $O_3$ gas supplied from the oxidizing gas nozzle 63, whereby one or more molecular layers of $SiO_2$ are formed. In the plasma formation region R3, the molecular layers of $SiO_2$ are modified by being exposed to plasma. By the rotation of the rotary table 2, the above-described cycle is repeatedly executed a plurality of times, whereby the molecular layers of $SiO_2$ are stacked to form an $SiO_2$ film on the surface of the wafer W.

Figure 6:
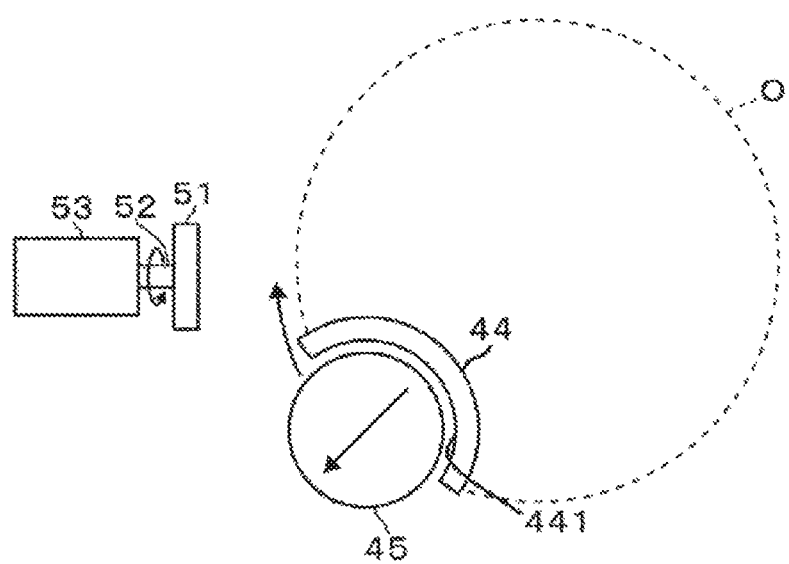
FIG. 6 is a first operation view of the magnetic gear mechanism.

When the rotary table 2 is rotated during the film forming process described above, the driven gear portion 45 connected to the predetermined wafer holder 24 moves along the movement orbit O shown in the schematic diagram of FIG. 6, for example. At this time, it is assumed that the solid line arrow affixed to the upper surface of the driven gear portion 45 faces a predetermined direction when the driven gear portion 45 just before passing through the region in which the driven gear portion 45 faces the driving gear portion 51, when viewed from the upper surface side.

Figure 7:
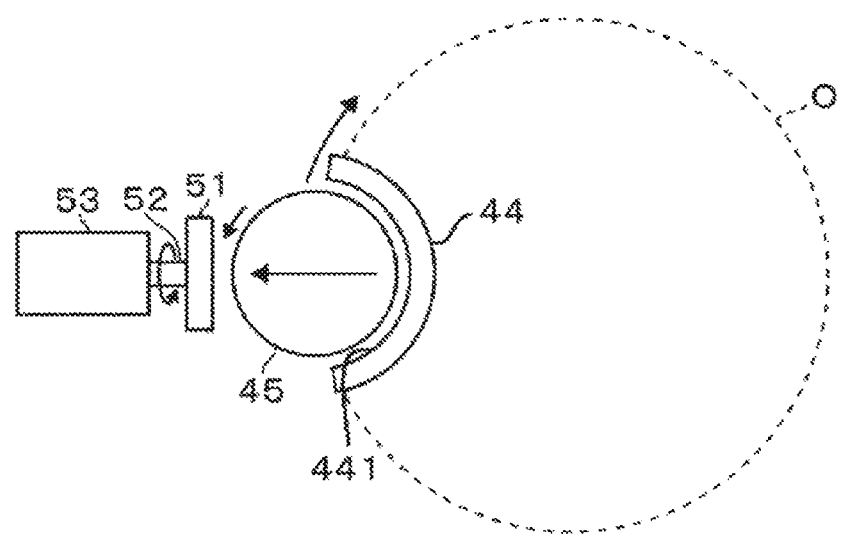
FIG. 7 is a second operation view of the magnetic gear mechanism.

When the driven gear portion 45 further moves and reaches a region which is located opposite the driving gear portion 51 as shown in FIG. 7, the action of the magnetic force lines M formed between the permanent magnet 510 of the rotational drive part 53 and the permanent magnet 450 of the driven gear portion 45 becomes larger. At this time, the driving gear portion 51 is rotated so that the permanent magnet 510 moves in a direction opposite to the moving direction of the permanent magnet 450 (the driven gear portion 45). Thus, along with the movement of the magnetic force lines M, the driven gear portion 45 rotates (In the example of FIG. 7, the driven gear portion 45 rotates counterclockwise when viewed from the upper surface side).

Figure 8:
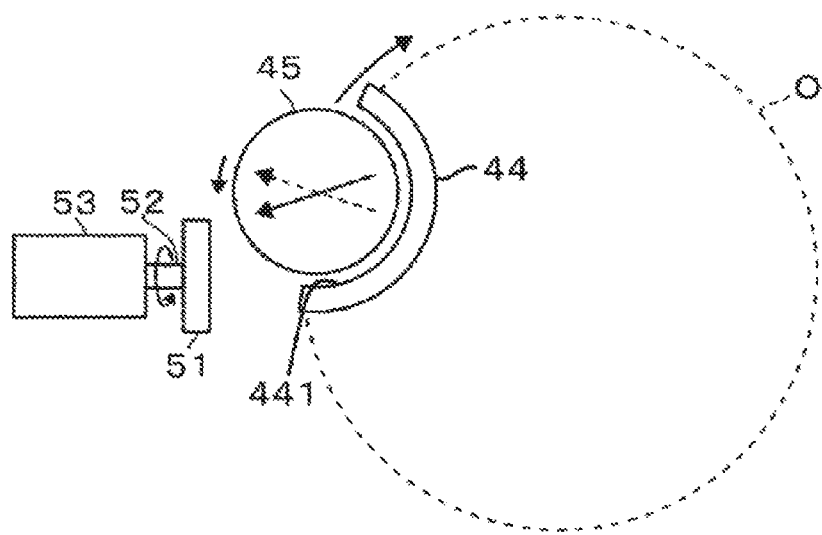
FIG. 8 is a third operation view of the magnetic gear mechanism.

As a result, as shown in FIG. 8, during the period of passing through the region facing the driving gear portion 51, the driven gear portion 45 rotates by a predetermined angle from the direction of the arrow indicated by a broken line to the direction of the arrow indicated by a solid line. As the driven gear portion 45 rotates, the wafer holder 24 connected to the driven gear portion 45 rotates about the rotation shaft 26. After the driven gear portion 45 has passed through a region facing the driving gear portion 51, the rotation of the driven gear portion 45 (the rotation of the rotation shaft 26) is stopped by the action of the magnetic force lines acting between the driven gear portion 45 and the brake portion 441.

The rotation angle of the driven gear portion 45 (the rotation angle of the rotation shaft 26) in the aforementioned operation can be adjusted by the rotation number per unit time of the driving gear portion 51, the distance between the driving gear portion 51 and the driven gear portion 45 when the driven gear portion 45 passes through the position facing the driving gear portion 51, or the like. In this regard, as the distance between the driving gear portion 51 and the driven gear portion 45 becomes smaller, the magnetic force lines M formed between the permanent magnets 510 and 450 grow stronger.

For example, as the rotation number per unit time of the rotary table 2 increases, the time taken for the driven gear portion 45 to pass through the position facing the driving gear portion 51 decreases. In this case, by moving the driving gear portion 51 to reduce the distance between the driving gear portion 51 and the driven gear portion 45, it is possible to apply stronger magnetic force lines M so that the rotation angle of the driven gear portion 45 (the rotation angle of the rotation shaft 26) can be maintained at a desired value.

The wafer holder 24 rotates by a predetermined rotation angle each time when the driven gear portion 45 connected to each wafer holder 24 passes through the region facing the driving gear portion 51 under the aforementioned operation. Accordingly, along with the rotation of the wafer holder 24, the wafer W placed on each wafer holder 24 is subjected to a cycle in which the molecular layer of $SiO_2$ is formed while gradually changing the direction as viewed from the upper surface side. By performing the film forming process while changing the orientation of the wafer W in this manner, even in the case where, for example, a variation in the concentration distribution of the raw material gas occurs in the adsorption region R1, the amount of the raw material gas adsorbed onto the wafer W can be made uniform in the circumferential direction of the wafer W when viewed in the entire period of the $SiO_2$ molecular layer formation cycle performed a plurality of times. As a result, it is possible to suppress unevenness in the film thickness of the $SiO_2$ film formed on the wafer W when seen in the circumferential direction of the wafer W.

After the molecular layers of $SiO_2$ are sequentially laminated by the aforementioned operation and the timing of formation of the $SiO_2$ film having a desired film thickness is reached, the rotation of the rotary table 2, the supply of various process gases and the formation of plasma are stopped to terminate the film forming process. Thereafter, the internal pressure of the vacuum container 11 is adjusted, the gate valve 38 is opened to allow the external transfer mechanism to enter the vacuum container 11, and the wafer W is unloaded in an order opposite to the wafer loading order.

The film forming apparatus 1 according to this embodiment has the following effects. When the film forming process is performed by supplying various process gases to the wafers W while revolving the wafers W placed on one surface side of the rotary table 2, the wafer holder 24, on which the wafer W is placed, is rotated using the magnetic gear mechanism which transmits the arrangement change on the side of the driving gear portion 51 (the rotation of the driving gear portion 51) to the side of the driven gear portion 45 via the magnetic force lines M. It is therefore possible to improve the uniformity of the film forming process in the circumferential direction of the wafer W. At this time, by using the non-contact-type magnetic gear mechanism, it is possible to suppress generation of particles due to the execution of the rotational operation.

Figure 9:
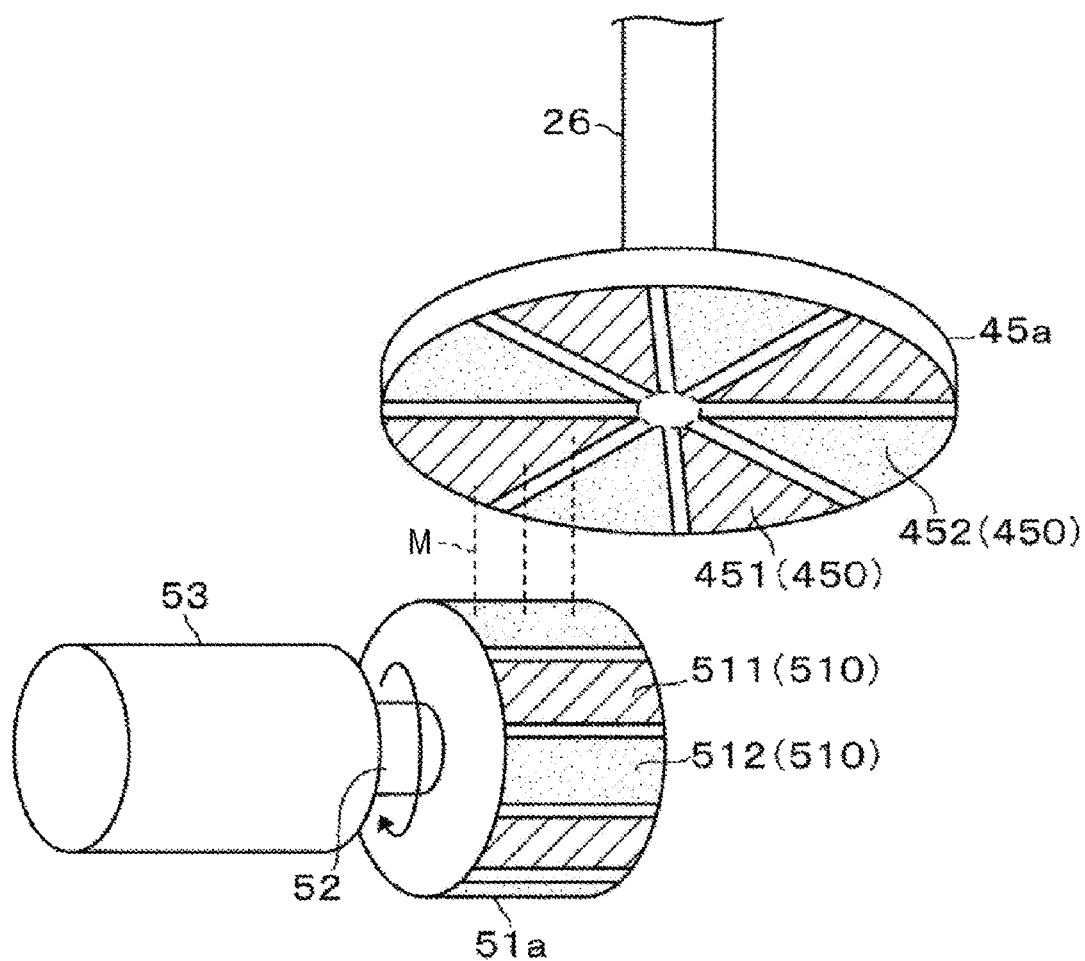
FIG. 9 is an enlarged perspective view of a magnetic gear mechanism according to another embodiment.

In this regard, the configurations of the driving gear portion 51 and the driven gear portion 45 of the magnetic gear mechanism are not limited to the example shown in FIG. 5 and so forth. For example, in the example shown in FIG. 9, a driven gear portion 45a in which a plurality of permanent magnets 450 (N pole faces 451 and S pole faces 452) are disposed in a mutually spaced-apart relationship is provided in the lower end portion of the rotation shaft 26. The driven gear portion 45a is disposed so that one surface (driven surface) thereof faces downward. On the other hand, a driving gear portion 51a has a configuration in which a plurality of permanent magnets 510 (N pole faces 511 and S pole faces 512) are disposed in a mutually spaced-apart relationship on the side circumferential surface of a cylinder. The driving gear portion 51a is disposed so that, when the driven gear portion 45a passes through a predetermined position on a movement orbit O, the side circumferential surface (driving surface) of the driving gear portion 51a is opposed to the lower side of the driven gear portion 45a. In this case, for example, the rotational drive part 53 is moved up and down to adjust the distance between the driving gear portion 51a and the driven gear portion 45a.

Figure 10:
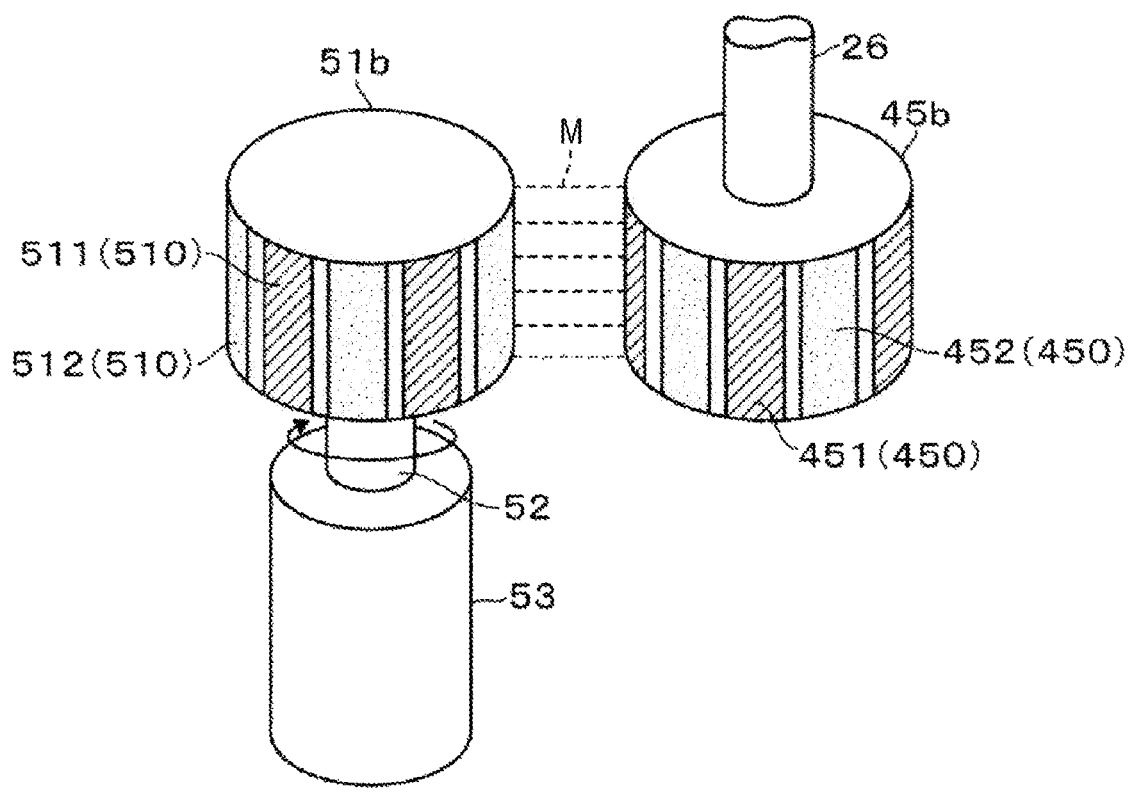
FIG. 10 is an enlarged perspective view of a magnetic gear mechanism according to a further embodiment.

Furthermore, it is not necessary to form the driving gear portion 51 or 51a and the driven gear portion 45 or 45a by combining a cylinder and a disc. As shown in FIG. 10, a driving gear portion 51b and a driven gear portion 45b may be formed by cylinders. The driving gear portion 51b may be disposed so that, when the driven gear portion 45b passes through a predetermined position on a movement orbit O, the side circumferential surfaces of the driving gear portion 51b and the driven gear portion 45b face each other. In this case, for example, the rotational drive part 53 is moved in the lateral direction to adjust the distance between the driving gear portion 51b and the driven gear portion 45b.

Furthermore, the movement of the driving surface of the driving gear portion is not limited to the case of being generated by the rotation of a disc or a cylinder. For example, a straight-rod-shaped rack type driving gear (not shown) formed by developing the side circumferential surface of the driving gear portion 51b shown in FIG. 10 into a flat surface may be adopted. In this case, it is possible to move the driving surface by causing the side surface (driving surface) of the rack type driving gear to face the side circumferential surface of the driven gear portion 45b and reciprocating the driving gear in the longitudinal direction.

More specifically, when the driven gear portion 45b to be rotated moves to a position facing the rack type driving gear, the driving gear is moved in the direction of rotation of the driven gear portion 45b. When the driven gear portion 45b moves away from the position facing the driving gear, the driving gear is moved to the original position during the period until the next driven gear portion 45b approaches the driving gear. This operation is repeated. Even with the aforementioned operation, it is possible to rotate each driven gear portion 45b by a predetermined angle.

In addition, it is not indispensable to provide the permanent magnets 510 and 450 in both the driving gear and the driven gear of the magnetic gear mechanism. The permanent magnets 510 or 450 may be provided only in one of the driving gear and the driven gear. The other of the driving gear and the driven gear may be made of a ferromagnetic material. In FIG. 11, permanent magnets 510 are provided on the side of a driving gear portion 51c. A driven gear portion 45c is made of, for example, stainless steel which exhibits ferromagnetism. In the case where permanent magnets 450 are not provided on the side of the driven gear portion 45c, the rotation of the driven gear portion 45c may be stopped using a brake portion 441 having a brake surface provided with a permanent magnet.

It is also not essential to make a driven gear with a ferromagnetic material. For example, if the driven gear portion 45b shown in FIG. 10 is made of a conductive material not provided with permanent magnets 450 and if the driving gear portion 51b in which the N pole faces 511 and the S pole faces 512 are alternately disposed is rotated, an eddy current flows on the side circumferential surface of the driven gear portion 45b. The driven gear portion 45b can be rotated by the interaction between the magnetic field generated by the eddy current and the magnetic field generated on the side of the driving gear portion 51b. In this case, the driven gear portion 45b may be made of a paramagnetic material such as aluminum or the like.

In this regard, the shapes of the permanent magnets 510 and 450 exposed on the surfaces of the driving gear and the driven gear which are a cylinder and a disc are not limited to the examples illustrated in FIGS. 5 and 9 to 11. For example, the shape of the N pole faces 511 and the S pole faces 512 of the fan-shaped permanent magnets 510 on one side of the driving gear portion 51 shown in FIG. 5 and the shape of the N pole faces 451 and the S pole faces 452 of the rectangular permanent magnets 450 on the side circumferential surface of the driven gear portion 45 may be appropriately changed.

Furthermore, it is not indispensable to alternately dispose the N pole faces 511 or 451 and the S pole faces 512 or 452, which have different poles. For example, the N pole faces 511 or the S pole faces 512 may be uniformly exposed on one face (driving face) of the driving gear portion 51 shown in FIG. 5, and the S pole faces 452 or the N pole faces 451 having different poles from the N pole faces 511 or the S pole faces 512 of the driving gear portion 51 may be uniformly exposed on the side circumferential surface (driven surface) of the driven gear portion 45. Even in this case, by rotating the driving gear portion 51, it is possible to move the magnetic force lines M to rotate the driven gear portion 45.

Needless to say, the planar shape of the driving gear portion 51 shown in FIG. 5 may be formed in an elliptical shape or a quadrangular shape, and the width dimension of the side circumferential surface of the driven gear portion 45 may be changed in the circumferential direction, thereby forming a driving surface or a driven surface in a deformed shape. In addition, there is no particular limitation on the arrangement position and arrangement number of the driving gear portion when viewed from the upper surface side. The arrangement position and arrangement number may be freely adjusted.

For example, in the example described with reference to FIGS. 6 to 8, it is not an essential requirement that the driving gear portion 51 is rotated so that the permanent magnet 510 can move in a direction opposite to the moving direction of the permanent magnet 450 (the driven gear portion 45). For example, the driving gear portion 51 may be rotated in the direction (clockwise) opposite to the direction shown in these figures (counterclockwise viewed from one surface side of the driving gear portion 51). In the case where the relative moving speed of the permanent magnet 510 is higher than the moving speed of the permanent magnet 450, the driven gear portion 45 is rotated clockwise when viewed from the upper surface side. In the case where the relative moving speed is low, the driven gear portion 45 is rotated counterclockwise when viewed from the upper surface side.

Furthermore, it is not indispensable to partition the space above and below the support plate 42 by the support plate 42 which supports the wafer holders 24. For example, the wafer holders 24 may be supported by spokes extending from the rotary shaft 21. Moreover, in the case where the wafer holders 24, the rotation shafts 26, the bearing units 43 and the like are lightweight, instead of the method of supporting the wafer holders 24 using the support plate 42 independently of the rotary table 2, it goes without saying that the bearing units 43 may be directly attached to the rotary table 2 and the wafer holders 24 may be supported by the rotary table 2. In the case where the wafer holders 24 are supported by the rotary table 2, it is preferred that the process temperature of the film forming process is 200 degrees C. or less. Examples of such a configuration includes, for example, a configuration in which a tubular body connected at its upper end to the opening edge of the through-hole of the rotation shaft 26 of the rotary table 2 and extending to the lower side of the heater 33 is provided, the rotation shaft 26 is attached to the tubular body via a bearing, and the driven gear portion 45 is provided on the lower side of the rotation shaft 26.

In addition, the present disclosure may be applied to various substrate processing apparatuses that perform gas processing to the wafers W placed on the rotary table 2. Therefore, the present disclosure is not limited to being applied to a film forming apparatus that performs ALD but may be applied to a film forming apparatus that performs CVD. Furthermore, the present disclosure is not limited to being applied to the film forming apparatus. For example, the present disclosure may be applied to a modifying apparatus that performs only a modifying process of the surfaces of the wafers W by the plasma forming part 71 without supplying the raw material gas and the oxidizing gas by the gas nozzles 61 and 63 in the film forming apparatus 1 described above.

Descriptions will now be made on the relationship between the rotational speed (rotation number) (rpm) of the driving gear portion 51 with respect to the rotation of the wafer holders 24 and the rotational speed (revolution speed) (rpm) of the revolution of the rotary table 2. The film forming apparatus 1 employs an example in which the driving gear portion 51a rotates about a horizontal axis shown in FIG. 9 and the driven gear portion 45a rotates about a vertical axis. However, it may be possible to employ a configuration in which the driving gear portion 51 and the driven gear portion 45 are rotated about center axes and the driving surface is moved along the rotation direction. Furthermore, the rotary table 2 is rotated clockwise direction when viewed from the upper side. The driving gear portion 51a is rotated counterclockwise when the rotary table 2 is viewed from the outer peripheral side to the central side.

Descriptions will be made on, for example, a case where, when rotating the rotary table 2 and the driving gear portion 51a, the peripheral velocity of the driven surface of the driven gear portion 45a due to the revolution of the rotary table 2 and the peripheral velocity of the driving surface of the driving gear portion 51a are aligned with each other.

The peripheral velocity of the driven surface of the driven gear portion 45a is defined by a velocity obtained by multiplying the rotation radius of the driven surface of the driven gear portion 45a during the revolution of the rotary table 2 (the distance from the center of the rotary table 2 to the driven surface of the driven gear portion 45a) by the revolution speed. The peripheral velocity of the driving surface of the driving gear portion 51a is defined by a velocity obtained by multiplying the rotation radius of the driving surface (the distance from the center axis of the driving gear portion 51a to the driving surface) by the rotation speed of the driving gear portion 51a. In the above-described film forming apparatus 1, for example, when the rotational speed of the driving gear portion 51a is 190 rpm and the rotational speed of the rotary table 2 is 10 rpm, the peripheral velocity of the driven surface of the driven gear portion 45a and the peripheral velocity of the driving surface of the driving gear portion 51a are matched with each other.

Figure 12:
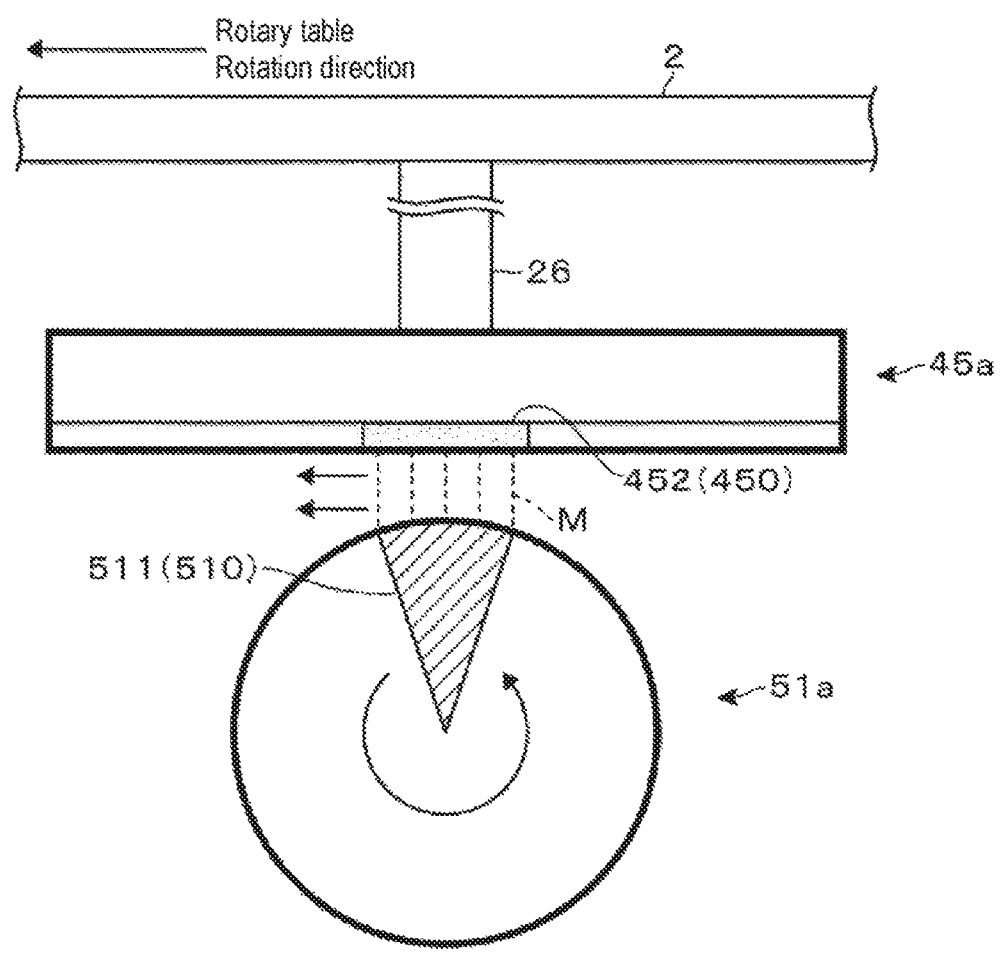
FIG. 12 is an explanatory view for explaining the rotation direction of a driven gear portion according to the rotation speed of a driving gear portion.

In this case, as shown in FIG. 12, when the driven gear portion 45a is rotated by the revolution of the rotary table 2 and the driven gear portion 45a and the driving gear portion 51a come closest to each other, if the NS (for example, the N pole face 511 and the S pole face 452) of the permanent magnet 510 of the driving surface of the driving gear portion 51a and the permanent magnet 450 of the driven surface of the driven gear portion 45a face each other, a rotation direction force acting about the center of the rotation shaft 26 is not applied to the driven gear portion 45a. Thus, the driven gear portion 45a does not rotate as it is. If the NS of the driving gear portion 51a and the NS of the driven gear portion 45a do not face each other, the driven gear portion 45a is rotated to the facing position by the attractive force and the repulsive force due to the magnetic force. Thereafter, the driven gear portion 45a does not rotate about its axis. That is to say, after the driven gear portion 45a approaches the driving gear portion 51a, the driven gear portion 45a does not rotate and the wafer holder 24 also does not rotate (the rotation angle becomes 0°).

Figure 13:
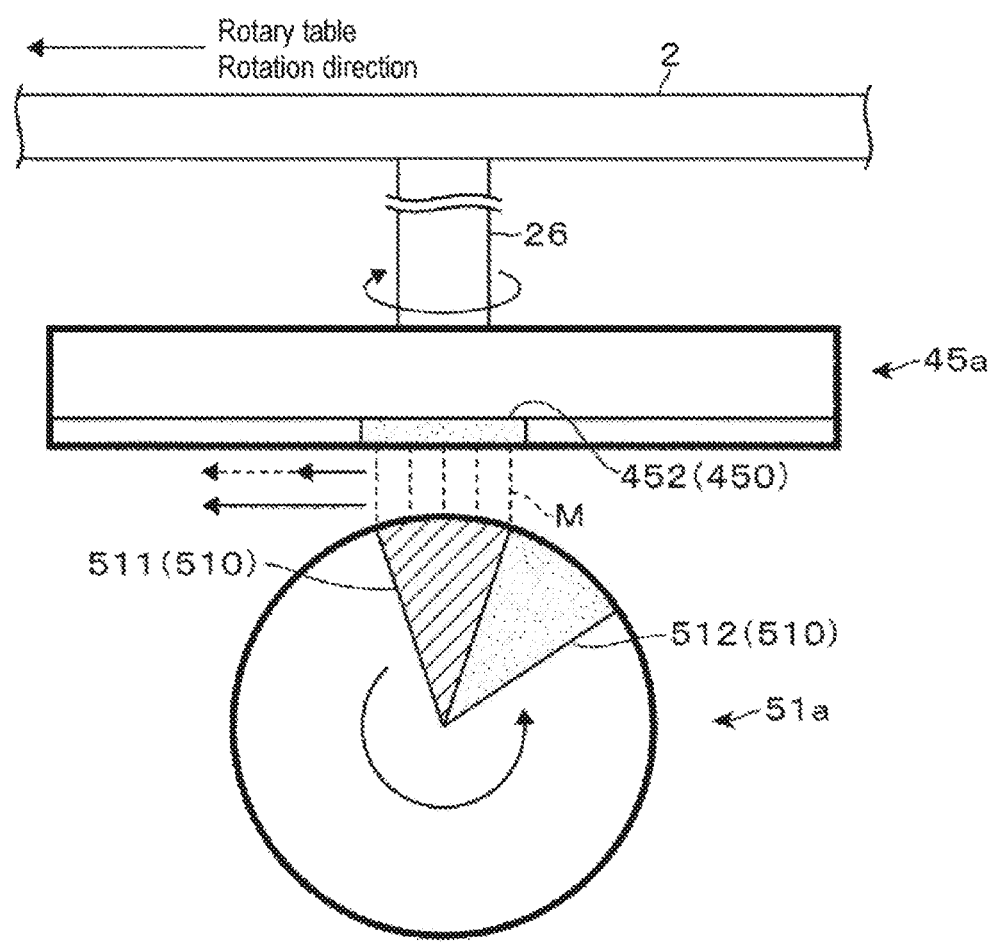
FIG. 13 is an explanatory view for explaining the rotation direction of the driven gear portion according to the rotation speed of the driving gear portion.

Descriptions will be made on a case where the rotational speed of the driving gear portion 51a is slightly higher than the rotational speed of the driving gear portion 51a (hereinafter referred to as "reference rotational speed") available when the peripheral velocity of the N pole face 511 of the driving gear portion 51a is aligned with the peripheral velocity of the driven surface of the driven gear portion 45a, for example, a case where the rotational speed of the driving gear portion 51a is 190.1 rpm and the rotation speed of the rotation table 2 is 10 rpm. When the driven gear portion 45a rotates due to the revolution of the rotary table 2 and when the driven gear portion 45a and the driving gear portion 51a come closest to each other, as shown in FIG. 13, the NS of the permanent magnet 510 of the driving surface of the driving gear portion 51a and the NS of the permanent magnet 450 of the driven surface of the driven gear portion 45a are attracted to each other or repelled from each other. Since the rotational speed of the driving gear portion 51a is higher than the reference rotational speed, the peripheral velocity of the driving surface of the driving gear portion 51a is higher than the peripheral velocity of the driven surface of the driven gear portion 45a.

Thus, as shown in FIG. 13, for example, the N pole face 511 of the driving gear portion 51a tries to rotate ahead of the S pole face 452 of the driven gear portion 45a. Therefore, the N pole face 511 of the driving gear portion 51a pulls the S pole face 452 of the driven gear portion 45a toward the front side in the rotation direction of the driving gear portion 51a by the attractive force of the magnetic force lines M. Furthermore, the S pole face 512 following the N pole face 511 of the driving gear portion 51a pushes the S pole face 452 of the driven gear portion 45a to the front side in the rotation direction of the driving gear portion 51a by the repulsive force. Accordingly, a force directed toward the rotation direction of the rotary table 2 is applied to the S pole face 452 of the driven gear portion 45a. Thus, the driven gear portion 45a rotates clockwise about the rotation shaft 26 when viewed from the upper side. The wafer holder 24 also rotates clockwise.

Figure 14:
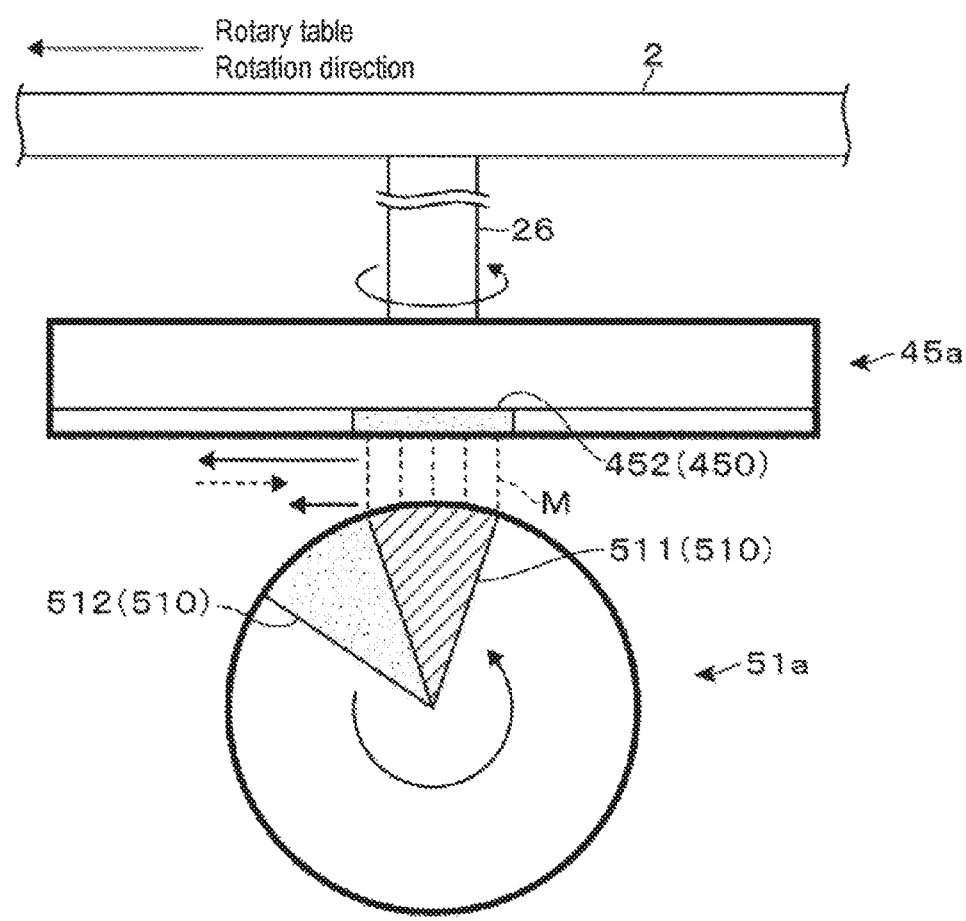
FIG. 14 is an explanatory view for explaining the rotation direction of the driven gear portion according to the rotation speed of the driving gear portion.

Descriptions will be made on a case where the rotational speed of the driving gear portion 51a is slightly lower than the reference rotational speed, for example, a case where the rotational speed of the driving gear portion 51a is 189.9 rpm and the rotational speed of the rotary table 2 is 10 rpm. When the driven gear portion 45a rotates due to the revolution of the rotary table 2 and when the driven gear portion 45a and the driving gear portion 51a come closest to each other, as shown in FIG. 14, the NS of the permanent magnet 510 of the driving surface of the driving gear portion 51a and the NS of the permanent magnet 450 of the driven surface of the driven gear portion 45a are attracted to each other or repelled from each other. Since the rotational speed of the driving gear portion 51a is lower than the reference rotational speed, the peripheral velocity of the driving surface of the driving gear portion 51a is lower than the peripheral velocity of the driven surface of the driven gear portion 45a.

Thus, as shown in FIG. 14, for example, the N pole face 511 of the driving gear portion 51a lies behind the S pole face 452 of the driven gear portion 45a. Therefore, the N pole face 511 of the driving gear portion 51a pulls the S pole face 452 of the driven gear portion 45a toward the rear side in the rotation direction of the driving gear portion 51a by the attractive force of the magnetic force lines M. Furthermore, the S pole face 512 preceding the N pole face 511 of the driving gear portion 51a pushes the S pole face 452 of the driven gear portion 45a to the rear side in the rotation direction of the driving gear portion 51a by the repulsive force. Accordingly, a force acting opposite to the rotation direction of the rotary table 2 is applied to the S pole face 452 of the driven gear portion 45a. Thus, the driven gear portion 45a rotates counterclockwise about the rotation shaft 26 when viewed from the upper side. The wafer holder 24 also rotates counterclockwise.

By increasing and reducing the rotational speed of the driving gear portion 51a from the reference rotational speed with respect to the speed of the rotary table 2 as described above, it is possible to switch the rotational direction of the wafer holder 24 between the clockwise direction and the counterclockwise direction. Furthermore, when the rotational speed of the driving gear portion 51a is set at a rotational speed ranging from a rotational speed higher than the reference rotational speed to a rotational speed lower than the reference rotational speed as shown in an example to be described later, the rotational speed of the driving gear portion 51a and the rotation angle of the wafer holder 24 available when the rotary table 2 makes one turn are approximately proportional to each other. When the rotation speed of the driving gear portion 51a is set to fall within a range in which the rotational speed of the driving gear portion 51a and the rotation angle of the wafer holder 24 are substantially proportional to each other, the variation in the rotation angle of the wafer holder 24 for each rotation of the rotary table 2 is reduced and the wafer holder 24 is rotated at constant intervals.

As described above, the reference rotational speed of the driving gear portion 51a is determined with respect to the rotational speed of the revolution of the rotary table 2. The rotational speed of the driving gear portion 51a is increased and decreased from the reference rotational speed, thereby adjusting the rotational speed of the driving gear portion 51a so as to fall within a range in which the rotational speed of the driving gear portion 51a and the rotation angle of the wafer holder 24 available when the rotary table 2 makes one turn are approximately proportional to each other. Therefore, it is possible to stably adjust the rotation angle and rotation direction of the wafer holder 24 per rotation of the rotary table 2. If the rotation angle of the wafer holder 24 is stabilized by setting the rotational speed of the driving gear portion 51a in this manner, the rotation angle of the wafer W during the film forming process is stabilized and the in-plane uniformity of the wafer W is also improved. Since the rotational speed of the driving gear portion 51a and the rotation angle of the wafer holder 24 available when the rotary table 2 makes one turn are approximately proportional to each other, the rotation angle (rotation speed) of the wafer W can be adjusted by adjusting the rotational speed of the driving gear portion 51a.

In the present disclosure, permanent magnets may be provided in one of the driven surface of the driven gear portion 45 and the driving surface of the driving gear portion 51. A ferromagnetic material for forming the aforementioned magnetic force lines with the permanent magnets may be provided in the other of the driven surface and the driving surface. However, if the permanent magnets having different poles are alternately disposed on the driven surface of the driven gear portion 45 along the rotation direction of the driven gear portion 45 and if the permanent magnets having different poles are alternately disposed on the driving surface of the driving gear portion 51 along the moving direction of the driving surface, it is possible to utilize not only the attractive force generated by the magnetic force lines M but also the repulsive force generated between the same poles. Thus, the force for driving the driven gear portion 45 is stabilized and the rotation angle of the wafer W becomes more stable.

Due to the distance between the driven gear portion 45a and the driving gear portion 51a available when the driven gear portion 45a is aligned with the position of the driving gear portion 51a, the permanent magnets may not be firmly attracted to each other or may not be sufficiently attracted to each other. Thus, the driven gear portion 45a may not be sufficiently rotated. For that reason, it is preferable to stabilize the rotation angle of the wafer holder 24 by appropriately setting the distance between the driven gear portion 45a and the driving gear portion 51a. As shown in the example to be described later, when the rotational speed of the revolution of the rotary table 2 is 10 rpm, it is possible to stably control the rotation angle of the wafer holder 24 if the distance between the driven surface of the driven gear portion 45 and the driving surface of the driving gear portion 51 is set to be 0.5 to 1.0 mm. In particular, it is preferable to set the distance to be 0.7 to 1.0 mm. Furthermore, when the rotational speed of the revolution of the rotary table 2 is set at 20 to 30 rpm, it is possible to stably control the rotation angle of the wafer holder 24 by setting the distance between the driven gear portion 45a and the driving gear portion 51a to be 1 mm or less, for example, 0.5 mm.

EXAMPLE

In order to verify the effects of the embodiment described above, the following tests were conducted. In order to investigate the rotation angle of the wafer holder 24 when setting the rotational speed of the revolution of the rotary table 2 and the rotational speed of the driving gear portion 51a, tests were conducted using the film forming apparatus 1 provided with the driven gear portion 45a and the driving gear portion 51a shown in FIG. 9 by setting the rotational speed of the revolution of the rotary table 2 and the rotational speed of the driving gear portion 51a as shown in examples 1 to 3. In examples 1 to 3, the distance between the driving surface of the driving gear portion 51a and the driven surface of the driven gear portion 45a available when the driving gear portion 51a and the driven gear portion 45a are closest to each other was set to be 1.0 mm.

Example 1

The rotational speed of the rotary table 2 was set at 10 rpm and the rotational speed of the driving gear portion 51a was set into 8 types from 189.6 to 190.3 rpm at intervals of 0.1 rpm.

Example 2

The rotational speed of the rotary table 2 was set at 20 rpm and the rotational speed of the driving gear portion 51a was set into 5 types from 383.1 to 383.5 rpm at intervals of 0.1 rpm.

Example 3

The rotational speed of the rotary table 2 was set at 30 rpm and the rotational speed of the driving gear portion 51a was set into 3 types from 574.9 to 575.1 rpm at intervals of 0.1 rpm.

Figure 15:
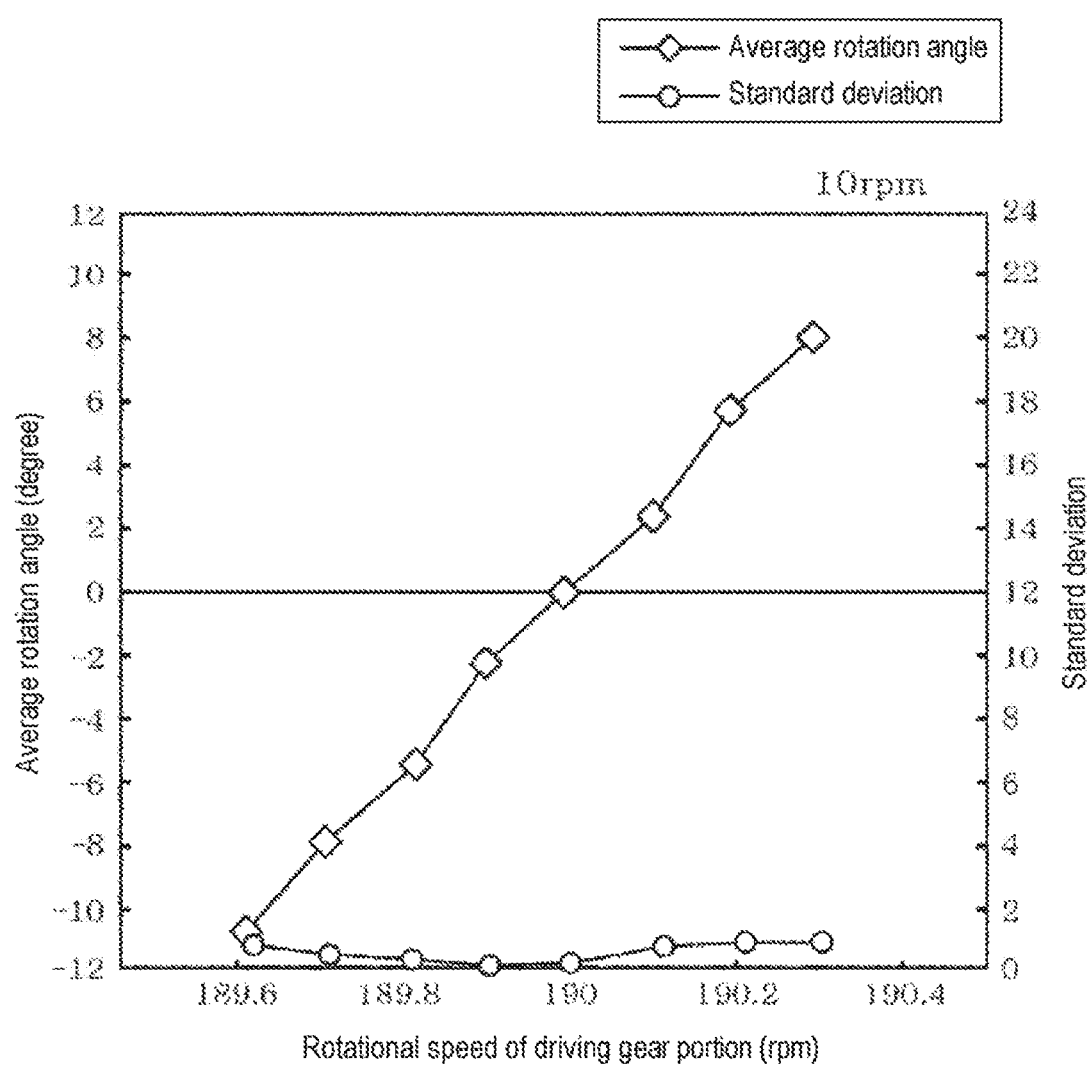
FIG. 15 is a characteristic diagram showing the rotation speed of the driving gear portion and the average rotation angle of a wafer holder 24 in example 1.
Figure 16:
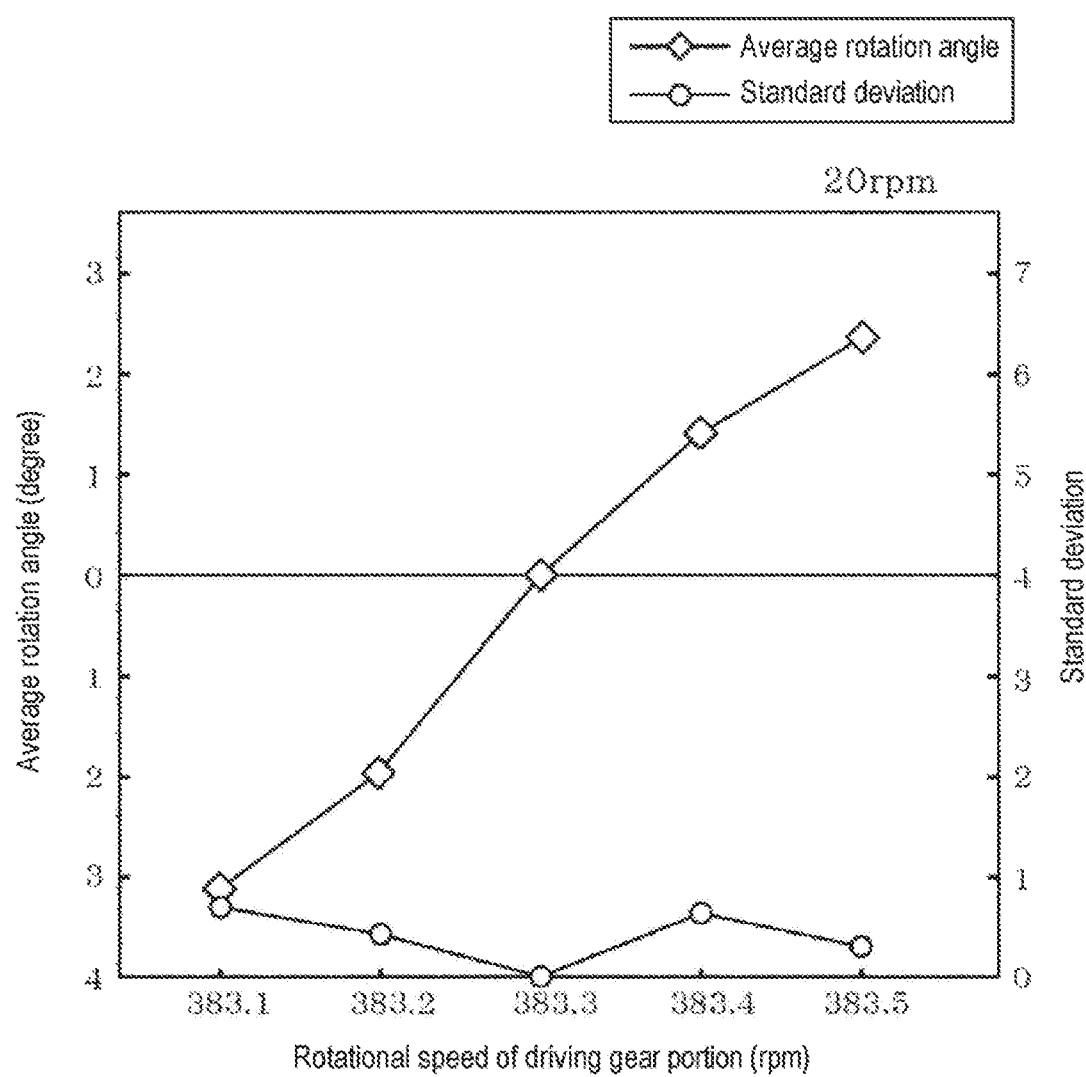
FIG. 16 is a characteristic diagram showing the rotation speed of the driving gear portion and the average rotation angle of the wafer holder 24 in example 2.
Figure 17:
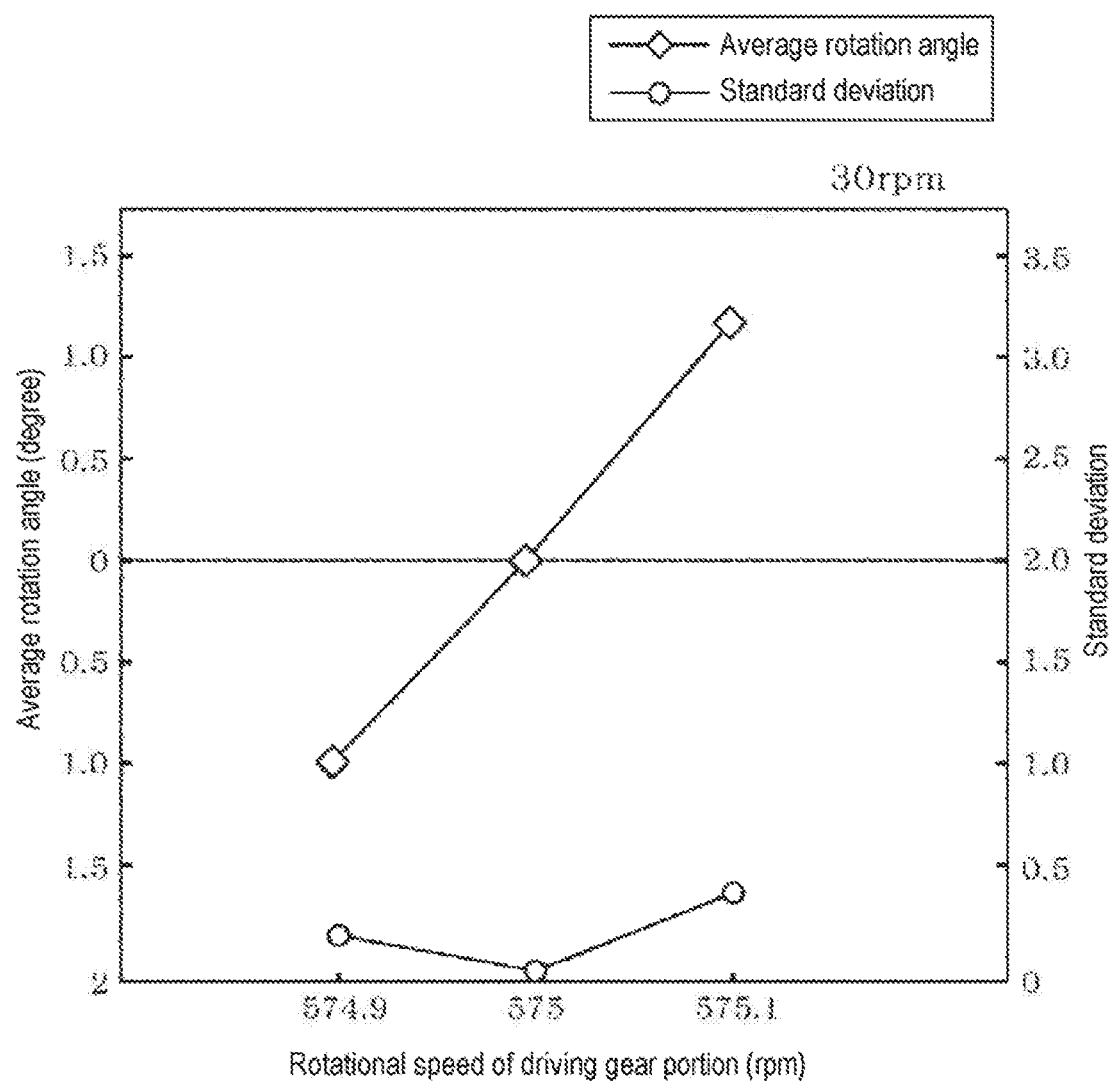
FIG. 17 is a characteristic diagram showing the rotation speed of the driving gear portion and the average rotation angle of the wafer holder 24 in example 3.
Figure 18:
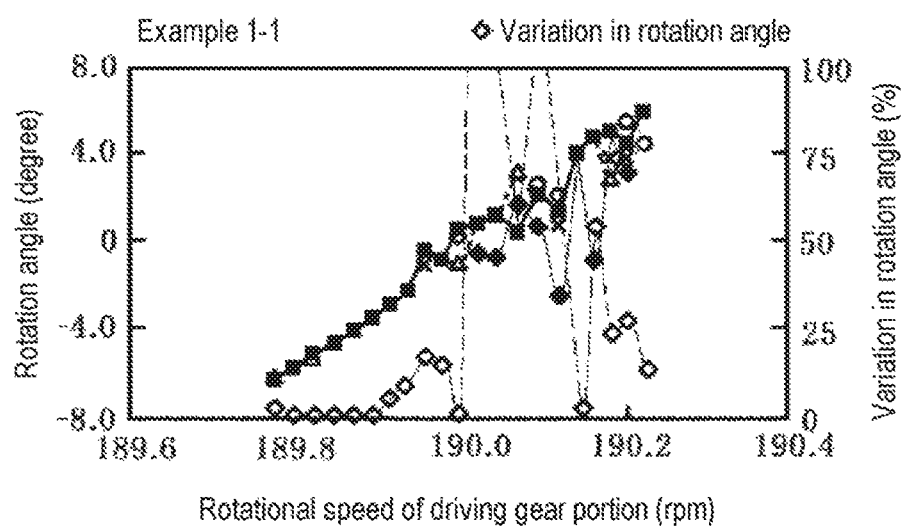
FIG. 18 is a characteristic diagram showing the rotation angle of each wafer holder in example 1-1.
Figure 19:
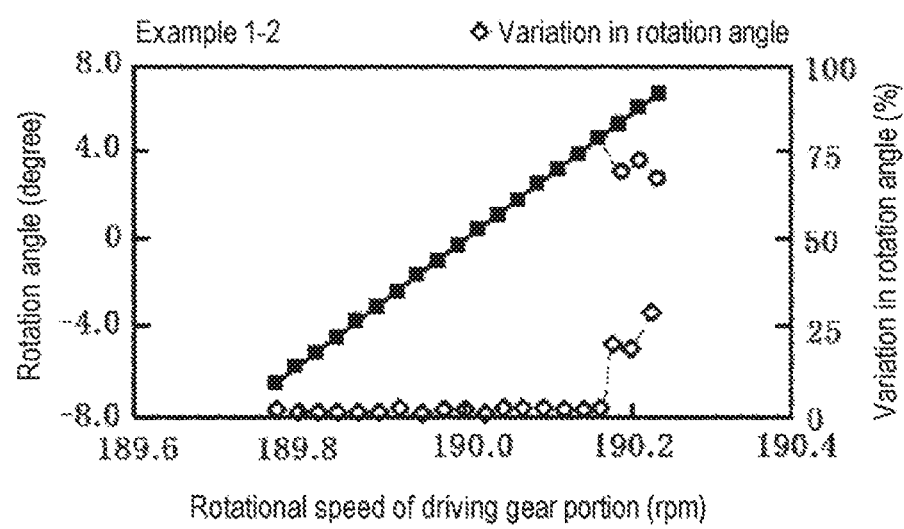
FIG. 19 is a characteristic diagram showing the rotation angle of each wafer holder in example 1-2.
Figure 20:
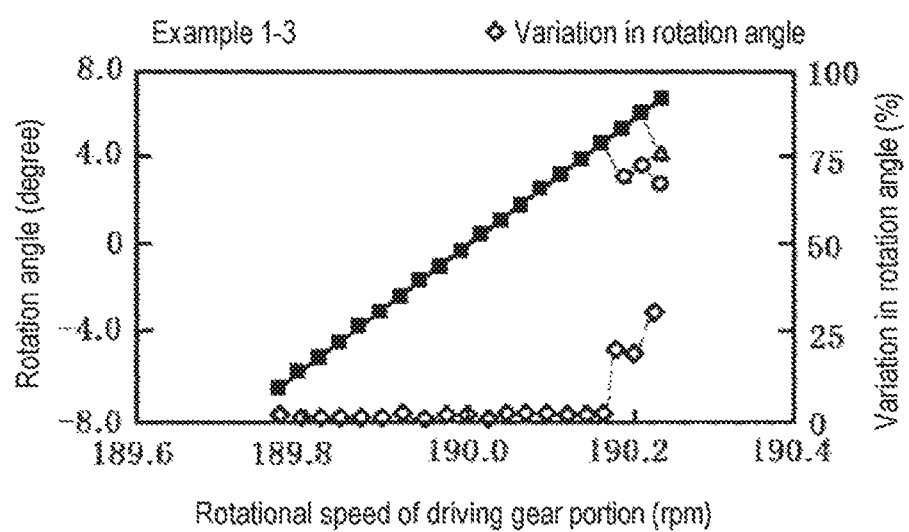
FIG. 20 is a characteristic diagram showing the rotation angle of each wafer holder in example 1-3.
Figure 21:
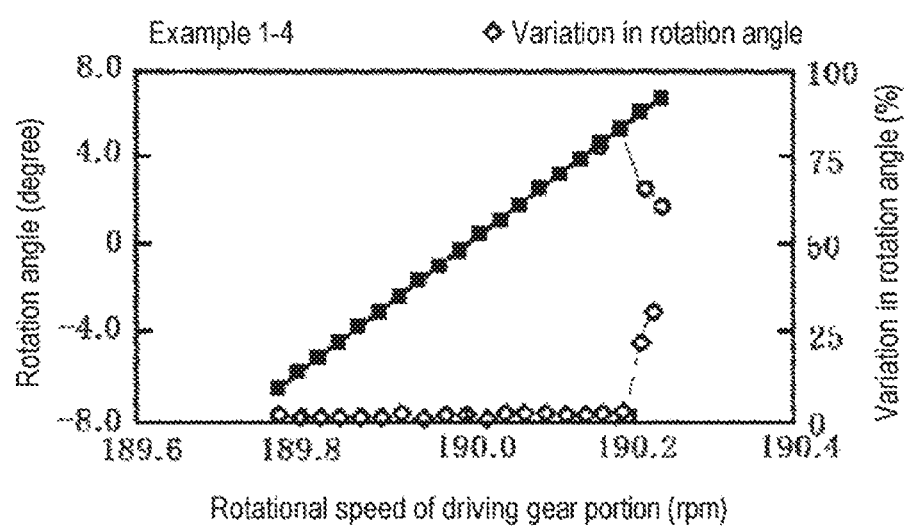
FIG. 21 is a characteristic diagram showing the rotation angle of each wafer holder in example 1-4.
Figure 22:
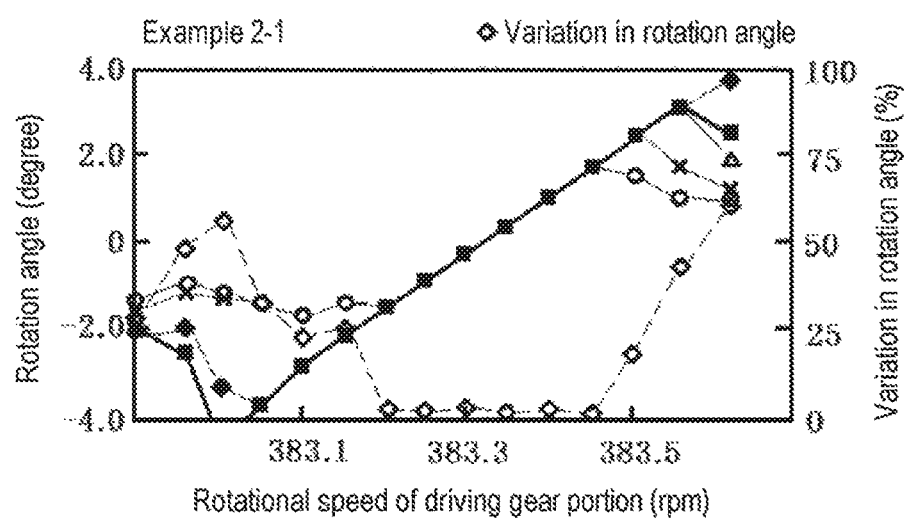
FIG. 22 is a characteristic diagram showing the rotation angle of each wafer holder in example 2-1.
Figure 23:
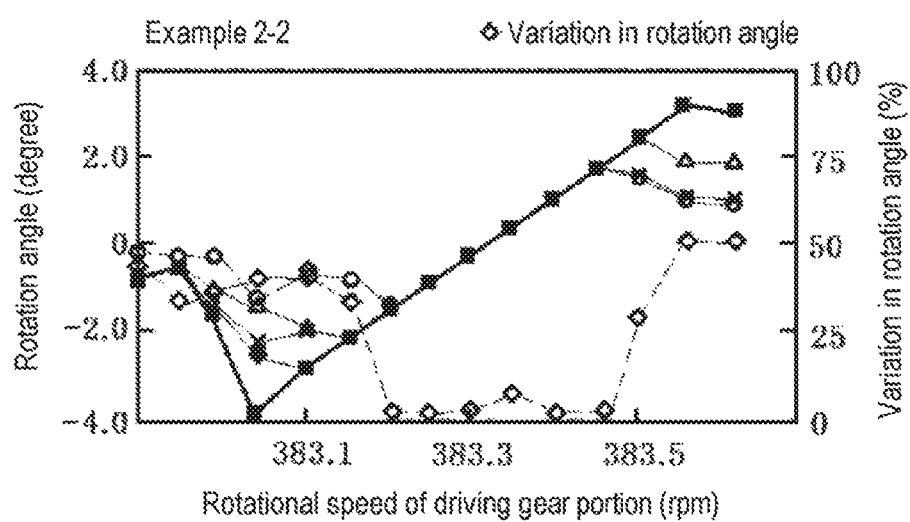
FIG. 23 is a characteristic diagram showing the rotation angle of each wafer holder in example 2-2.
Figure 24:
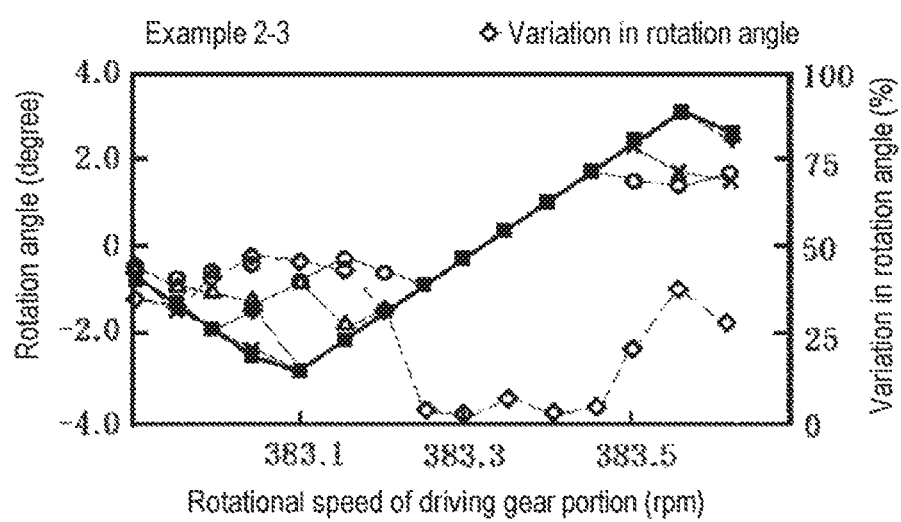
FIG. 24 is a characteristic diagram showing the rotation angle of each wafer holder in example 2-3.
Figure 25:
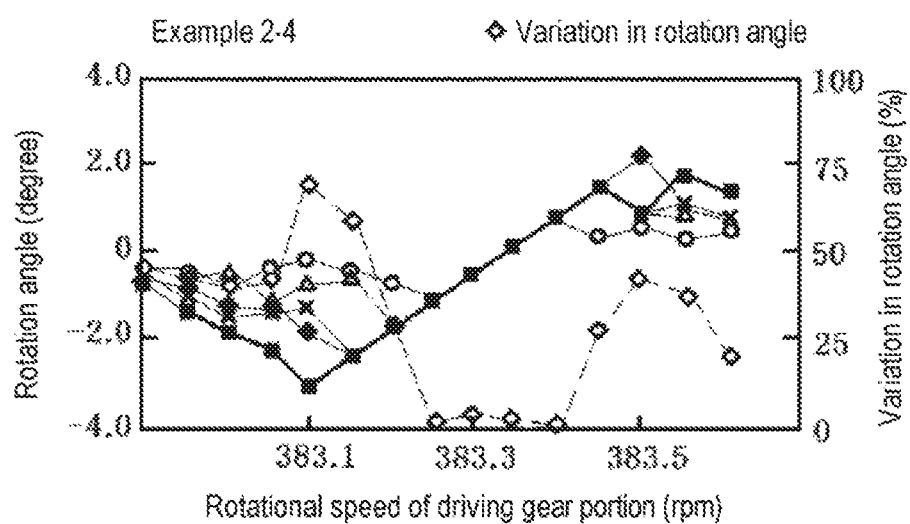
FIG. 25 is a characteristic diagram showing the rotation angle of each wafer holder in example 2-4.
Figure 26:
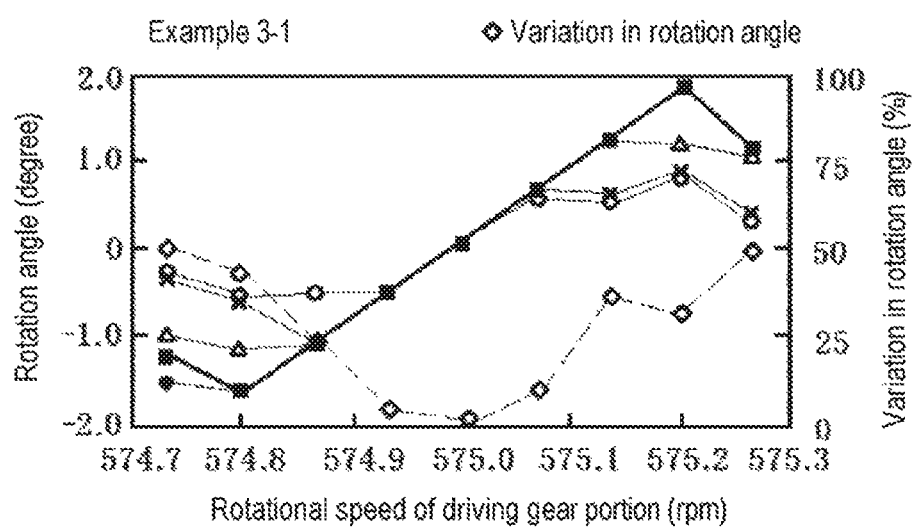
FIG. 26 is a characteristic diagram showing the rotation angle of each wafer holder in example 3-1.
Figure 27:
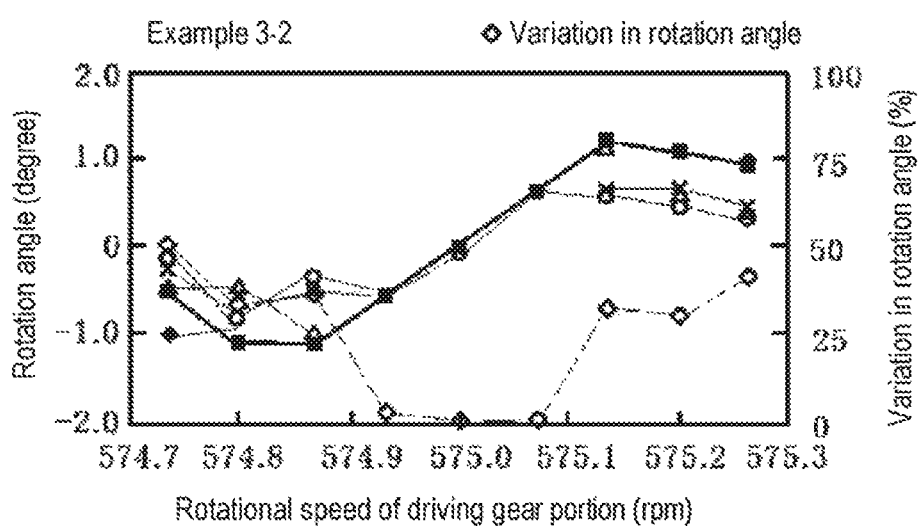
FIG. 27 is a characteristic diagram showing the rotation angle of each wafer holder in example 3-2.
Figure 28:
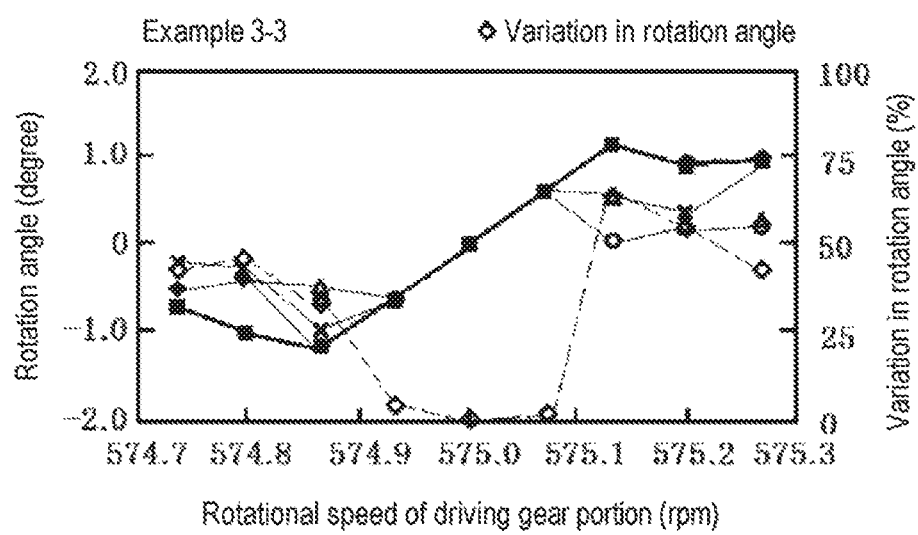
FIG. 28 is a characteristic diagram showing the rotation angle of each wafer holder in example 3-3.
Figure 29:
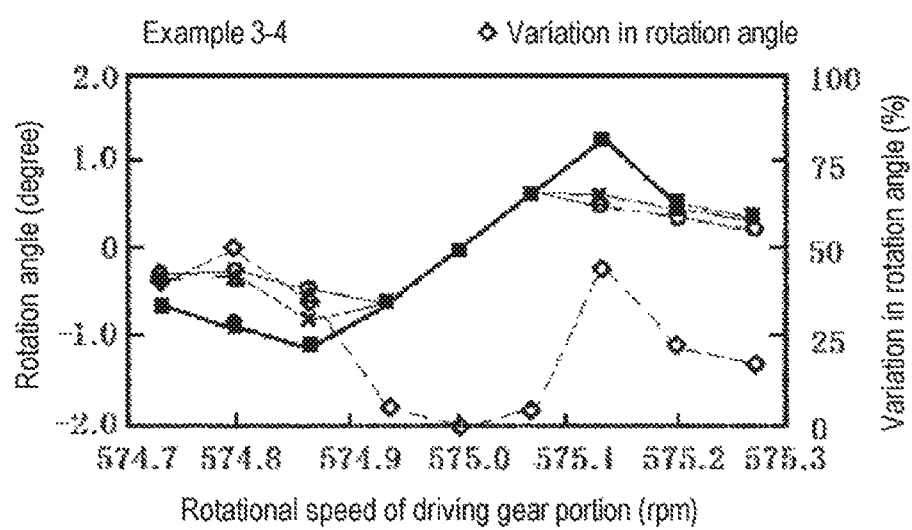
FIG. 29 is a characteristic diagram showing the rotation angle of each wafer holder in example 3-4.

In each of examples 1 to 3, by the imaging of a high-sensitivity camera, the rotation angle of each of the five wafer holders 24 available when rotating the rotary table 2 by ten rotations was measured and the rotation angle (°) of the wafer holder 24 available when the rotary table 2 rotates once was measured. Hereinafter, the term "rotation angle" refers to the rotation angle of the wafer holder 24 available when the rotary table 2 rotates once. FIGS. 15 to 17 are characteristic diagrams showing the relationship between the rotational speed (rpm) of the driving gear portion 51*a* available when the rotational speed of the rotary table 2 is set at 10, 20 and 30 rpm and the average rotation angle obtained by averaging the average value (°) of the rotation angles of five wafer holders 24. In the average rotation angle, the clockwise rotation is indicated by + and the counterclockwise rotation is indicated by −. The standard deviation indicates a standard deviation of the rotation angles between the five wafer holders 24.

As shown in FIG. 15, in the case where the rotation speed of the rotary table 2 was set at 10 rpm, the average rotation angle of the wafer holder 24 became 0° when the rotational speed of the driving gear portion 51*a* was set at 190 rpm. By making the rotational speed of the driving gear portion 51*a* higher than 190 rpm, the wafer holder 24 was rotated clockwise. By making the rotational speed of the driving gear portion 51*a* lower than 190 rpm, the wafer holder 24 was rotated counterclockwise. When the rotational speed of the driving gear portion 51*a* falls within a rotational speed range of from 189.6 to 190.3 rpm, the rotational speed of the driving gear portion 51*a* and the average rotation angle were substantially proportional to each other. When the rotational speed of the driving gear portion 51*a* was changed from 189.6 to 190.3 rpm, the average rotation angle was changed from −100 to +8°. The standard deviation was 1 or less and was very small.

As shown in FIG. 16, in the case where the rotation speed of the rotary table 2 was set at 20 rpm, the average rotation angle of the wafer holder 24 became 0° when the rotational speed of the driving gear portion 51*a* was set at 383.3 rpm. By making the rotational speed of the driving gear portion 51*a* higher than 383.3 rpm, the wafer holder 24 was rotated clockwise. By making the rotational speed of the driving gear portion 51*a* lower than 383.3 rpm, the wafer holder 24 was rotated counterclockwise. When the rotational speed of the driving gear portion 51*a* falls within a rotational speed range of from 383.1 to 383.5 rpm, the rotational speed of the driving gear portion 51*a* and the average rotation angle were substantially proportional to each other. When the rotational speed of the driving gear portion 51*a* was changed from 383.1 to 383.5 rpm, the average rotation angle was changed from −3° to +2°. The standard deviation was 1 or less and was very small.

As shown in FIG. 17, in the case where the rotation speed of the rotary table 2 was set at 30 rpm, the average value of the average rotation angles of the wafer holders 24 became 0° when the rotational speed of the driving gear portion 51*a* was set at 575.0 rpm. By making the rotational speed of the driving gear portion 51*a* higher than 575.0 rpm, the wafer holder 24 was rotated clockwise. By making the rotational speed of the driving gear portion 51*a* lower than 575.0 rpm, the wafer holder 24 was rotated counterclockwise. When the rotational speed of the driving gear portion 51*a* falls within a rotational speed range of from 574.9 to 575.1 rpm, the rotational speed of the driving gear portion 51*a* and the average rotation angle were substantially proportional to each other. When the rotational speed of the driving gear portion 51*a* was changed from 574.9 to 575.1 rpm, the average rotation angle was changed from −1° to +1°. The standard deviation was 1 or less and was very small.

According to this result, the rotational speed of the driving gear portion 51*a* at which the average rotation angle of the wafer holder 24 becomes 0° with respect to the rotational speed of the rotary table 2 is found. By increasing the rotational speed of the driving gear portion 51*a* from the rotational speed at which the average rotation angle becomes 0°, it is possible to rotate the wafer holder 24 to one side. By lowering the rotational speed of the driving gear portion 51*a* from the rotational speed at which the average rotation angle becomes 0°, it is possible to rotate the wafer holder 24 to the other side. For example, in the case where the rotational speed of the rotary table 2 is set at 10 rpm, the average rotation angle can be adjusted within a range of from −10° to +8° by adjusting the rotational speed of the driving gear portion 51*a*. Furthermore, by setting the rotational speed of the driving gear portion 51*a* so as to fall within a range in which the average rotation angle of the wafer holder 24 and the rotational speed of the driving gear portion 51*a* is approximately proportional to each other, the variation in the rotation angle of the wafer holder 24 becomes smaller and the rotation angle becomes stable.

In example 1, the examples in which the distance between the driven surface of the driven gear portion 45*a* and the driving surface of the driving gear portion 51*a* at the time of closest approach is at 0.5, 0.7, 0.9 and 1.0 mm were referred to as examples 1-1 to 1-4, respectively. In example 2 (3), the examples in which the distance between the driven surface of the driven gear portion 45*a* and the driving surface of the driving gear portion 51*a* at the time of closest approach is at 0.5, 0.7, 0.9 and 1.0 mm were referred to as examples 2-1 to 2-4 (3-1 to 3-4), respectively. In each of examples 1-1 to 3-4, after the rotational speeds of the driving gear portion 51*a* were set, the rotary table 2 was rotated 10 times, the rotation angles of each wafer holder 24 were measured after each rotation, and each of an average values of the measured rotation angles after the 10 rotations was taken as the rotation angle of each of the five wafer holders 24. In each of examples 1-1 to 3-4, the rotation angle of each wafer holder 24 was found for each rotation speed of the driving gear portion 51*a*, the average rotation angle and standard deviation were calculated from the rotation angles of the five wafer holders 24, and variation (%: (standard deviation/average rotation angle)×100) in the rotation angles of the five wafer holders 24 were found. In the rotation angle, the clockwise rotation is indicated by + and the counterclockwise rotation is indicated by −. FIGS. 18 to 21 are characteristic diagrams showing the rotation angle (°) of each wafer holder 24 with respect to the rotational speed (rpm) of the driving gear portion 51*a* in examples 1-1 to 1-4. FIGS. 22 to 25 are characteristic diagrams showing the rotation angle (°) of each wafer holder 24 with respect to the rotational speed (rpm) of the driving gear portion 51*a* in examples 2-1 to 2-4. FIGS. 26 to 29 are characteristic diagrams showing the rotation angle (°) of each wafer holder 24 with respect to the rotational speed (rpm) of the driving gear portion 51*a* in examples 3-1 to 3-4. The white diamond legend in each figure shows the variation in the rotation angle of the five wafer holders 24. In each characteristic diagram, the rotation angle of each of the five wafer holders 24 is distinguished by different legends.

Figure 30:
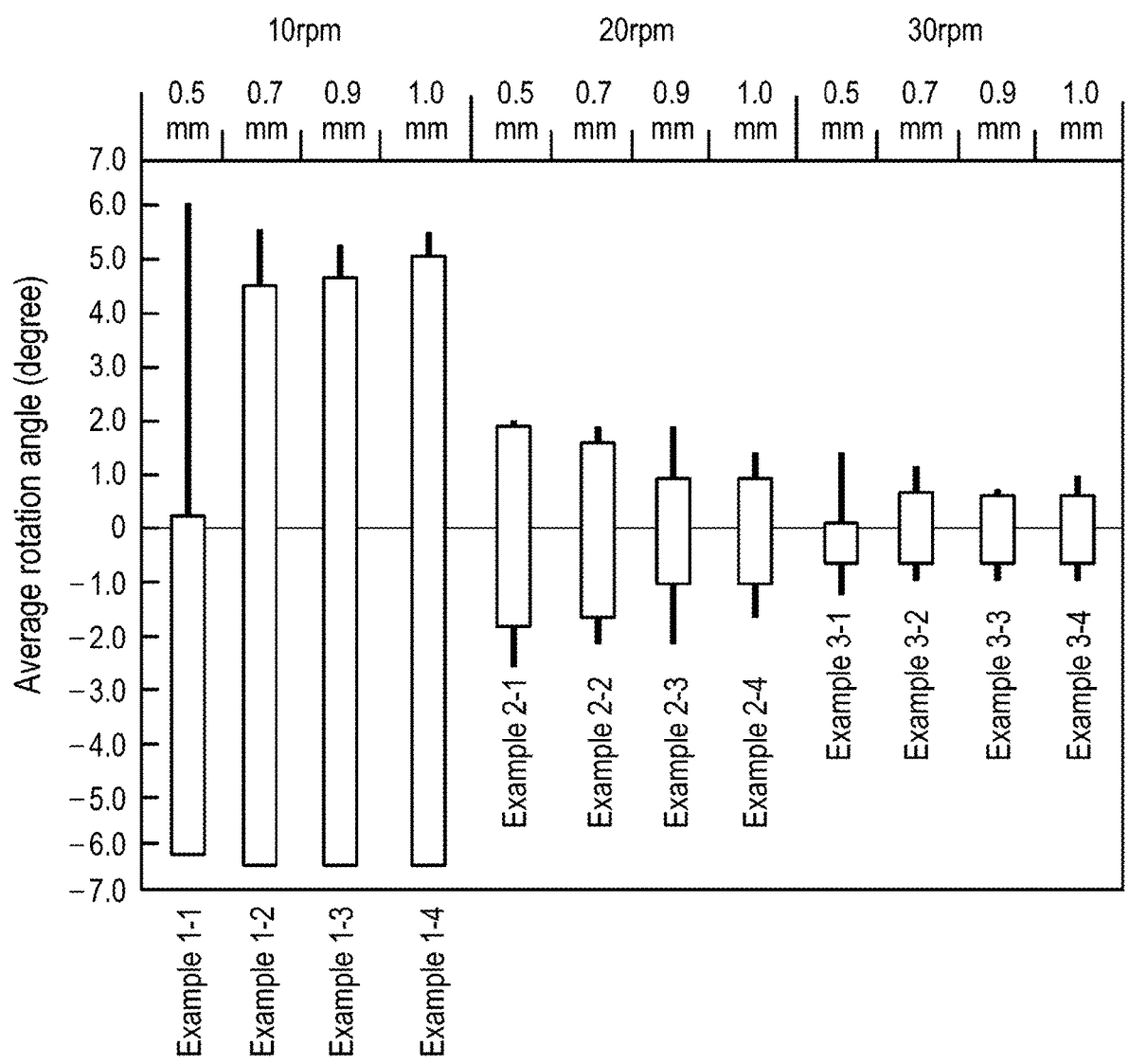
FIG. 30 is a characteristic diagram showing the range of the rotation angle and the range, in which the variation of the rotation angle is small, in examples 1-1 to 3-4.

FIG. 30 is a characteristic diagram showing the range of the average rotation angle measured in each of examples 1-1 to 3-4 and the range of the average rotation angle in which the variation in the rotation angles of the five wafer holders 24 becomes small and in which the rotation angles of the wafer holders 24 are stable. In the characteristic diagram of each example, the range from the upper end to the lower end of the characteristic diagram including the line portion indicates the range from the maximum value to the minimum value of the average rotation angle in the values measured in the characteristic diagrams of FIGS. 18 to 29. In each example, the range from the upper end to the lower end of the box portion of the characteristic diagram of each example in FIG. 30 indicates the range of the average rotation angle available when the variation value of the rotation angles of the five wafer holders 24 is 5% or less. In the range where the variation value of the rotation angles is 5% or less, the rotation angles of the five wafer holders 24 become uniform. In this range, the rotation angle of the wafer holder 24 can be stably controlled by setting the rotation speed of the driving gear portion 51a.

As shown in FIGS. 18 to 21, the variation in the rotation angle of each wafer holder 24 is large in example 1-1. However, the variation in the rotation angle of each wafer holder 24 is hardly seen in examples 1-2 to 1-4. As shown in FIG. 30, in examples 1-2 to 1-4, the average rotation angle is in the range of +4.5° to −6.5° and the variation value of the rotation angles of the five wafer holders 24 is 5% or less.

As shown in FIGS. 22 to 25 and 30, the range in which the variation value of the rotation angles of the five wafer holders 24 becomes 5% or less is wider in examples 2-1 and 2-2 than in examples 2-3 and 2-4. The rotation angle of the wafer holder 24 can be stably controlled in a range where the average rotation angle is +1.5° to −1.8°. Furthermore, as shown in FIGS. 26 to 29 and 30, the range in which the variation value of the rotation angles of the five wafer holders 24 becomes 5% or less is wider in examples 3-2 to 3-4 than in example 3-1. According to this result, it can be understood that it is easier to stably control the rotation angle of the wafer holder 24 as the rotational speed of the rotary table 2 becomes lower. Furthermore, when the rotational speed of the rotary table 2 is 10 rpm, the range in which the rotation angle of the wafer holder 24 can be stably controlled is wide. In particular, if the distance between the driven surface of the driven gear portion 45a and the driving surface of the driving gear portion 51a at the time of closest approach is set at 0.7 to 1.0 mm, it is possible to stably control the rotation angle of the wafer holder 24. In addition, when the rotational speed of the rotary table 2 is set at 20 to 30 rpm, the rotation angle of the wafer holder 24 can be stably controlled by bringing the distance between the driven surface of the driven gear portion 45a and the driving surface of the driving gear portion 51a close to 1 mm or less.

According to the present disclosure in some embodiments, when performing a process by supplying a process gas to substrates placed on one surface side of a rotary table while revolving the substrates, a mounting stand holding each of the substrates is rotated using a magnetic gear mechanism in which an arrangement change on the driving gear side is transmitted to the driven gear side via magnetic force lines. It is therefore possible to improve process uniformity in the circumferential direction of the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus in which a substrate is mounted on one surface side of a rotary table installed inside a process container and configured to rotate about a rotary shaft and in which a process is performed by supplying a process gas to the substrate while rotating the rotary table and consequently revolving the substrate, comprising:

a mounting stand installed to rotate about a rotation shaft extending along the rotary shaft of the rotary table and configured to hold the substrate; and a magnetic gear mechanism including a driven gear portion configured to rotate the mounting stand about the rotation shaft and a driving gear portion configured to drive the driven gear portion, wherein the driven gear portion is connected to the mounting stand via the rotation shaft and installed to rotate in such a direction as to rotate the mounting stand, the driven gear portion including a driven surface configured to form magnetic force lines with a driving surface provided in the driving gear portion and the driving gear portion is disposed in a state in which the driving surface faces the driven surface passing through a predetermined position on a movement orbit of the driven gear portion moving along with the rotation of the rotary table, the driving gear portion connected to a drive part configured to move the driving surface in order to move the magnetic force lines and rotate the driven gear portion, the drive part connected to one end of a drive shaft of the driving gear portion, wherein permanent magnets or a ferromagnetic material is installed on the driven surface and the driving surface to form the magnetic force lines between the driven surface and the driving surface, and wherein a support part configured to support the rotation shaft is installed in the rotary shaft of the rotary table, an opening into which the rotation shaft supported by the support part is inserted is formed in the rotary table, and the mounting stand is supported by the rotation shaft inserted into the opening independently from the rotary table.

2. The apparatus of claim 1, wherein the permanent magnets have different poles and are installed on the driven surface and the driving surface, and the magnetic force lines are formed between the permanent magnets having different poles installed on the driven surface and the permanent magnets having different poles installed on the driving surface.

3. The apparatus of claim 2, wherein the permanent magnets having different poles are alternately disposed on the driven surface along a rotation direction of the driven gear portion, and the permanent magnets having different poles are alternately disposed on the driving surface along a moving direction of the driving surface.

4. The apparatus of claim 1, wherein the permanent magnets are installed in one of the driven surface and the driving surface, and the ferromagnetic material configured to form the magnetic force lines with the permanent magnets installed in one of the driven surface and the driving surface is provided in the other of the driven surface and the driving surface.

5. The apparatus of claim 1, wherein the driven gear portion is a cylinder connected to the mounting stand so that a center axis of the cylinder coincides with the rotation shaft, the driven surface formed on a side circumferential surface of the cylinder, the driving gear portion is a disc configured to rotate about a rotation center, the driving surface formed on one surface side of the disc, and the drive part connected to the drive shaft is configured to rotationally drive the disc about the rotation center, the drive shaft disposed so as to extend in a direction intersecting the rotation shaft.

6. The apparatus of claim 1, wherein the driven gear portion is a disc connected to the mounting stand so that a rotation center of the disc coincides with the rotation shaft, the driven surface formed on one surface side of the disc,
the driving gear portion is a cylinder configured to rotate about a center axis, the driving surface formed on a side circumferential surface of the cylinder, and
the drive part connected to the drive shaft is configured to rotationally drive the cylinder about the center axis, the drive shaft disposed so as to extend in a direction intersecting the rotation shaft.

7. The apparatus of claim 1, wherein the rotary table is configured so that the rotation number per unit time of the rotary table can be increased or decreased, and
the drive part includes a position adjustment part configured to adjust an arrangement position of the driving gear portion in order to reduce a distance between the driving surface and the driven surface, in which the magnetic force lines are formed, as the rotation number of the rotary table is increased.

8. The apparatus of claim 1, wherein a brake part including a brake surface configured to stop rotation of the driven gear portion passed through a position facing the driving surface by allowing magnetic force lines, which are weaker than the magnetic force lines formed between the driven surface of the driven gear portion and the driving surface of the driving gear portion, to be formed between the driven surface and the brake surface, is installed around the driven gear portion and the brake surface is made of a ferromagnetic material or is provided with a permanent magnet.

9. The apparatus of claim 1, wherein the driving gear portion is configured to rotate about a center axis so that the driving surface moves along a rotation direction of the driving gear portion, and the driving gear portion has a rotational speed at which the rotational speed of the driving gear portion and a rotation angle of the mounting stand are substantially proportional to each other, the rotational speed of the driving gear portion set to become higher or lower than a rotational speed at which the rotation angle of the mounting stand when the rotary table rotates once becomes 0°.

* * * * *